(12) United States Patent
Meiser et al.

(10) Patent No.: US 10,381,475 B2
(45) Date of Patent: Aug. 13, 2019

(54) SEMICONDUCTOR DEVICE COMPRISING A TRANSISTOR CELL INCLUDING A SOURCE CONTACT IN A TRENCH, METHOD FOR MANUFACTURING THE SEMICONDUCTOR DEVICE AND INTEGRATED CIRCUIT

(71) Applicant: Infineon Technologies Dresden GmbH, Dresden (DE)

(72) Inventors: Andreas Meiser, Sauerlach (DE); Karl-Heinz Gebhardt, Dresden (DE); Till Schloesser, München (DE); Detlef Weber, Ottendorf-Okrilla (DE)

(73) Assignee: Infineon Technologies Dresden GmbH (DE)

( * ) Notice: Subject to any disclaimer, the term of this patent is extended or adjusted under 35 U.S.C. 154(b) by 0 days.

(21) Appl. No.: 15/785,677

(22) Filed: Oct. 17, 2017

(65) Prior Publication Data

US 2018/0040729 A1 Feb. 8, 2018

Related U.S. Application Data

(62) Division of application No. 15/234,520, filed on Aug. 11, 2016, now Pat. No. 9,859,418.

(30) Foreign Application Priority Data

Aug. 14, 2015 (DE) .......................... 10 2015 113 494
Apr. 26, 2016 (DE) .......................... 10 2016 107 714

(51) Int. Cl.
*H01L 29/78* (2006.01)
*H01L 29/417* (2006.01)
(Continued)

(52) U.S. Cl.
CPC ...... *H01L 29/7825* (2013.01); *H01L 21/2254* (2013.01); *H01L 29/0696* (2013.01);
(Continued)

(58) Field of Classification Search
CPC ............ H01L 29/7825; H01L 29/1083; H01L 29/41766; H01L 29/7835; H01L 29/66704;
(Continued)

(56) References Cited

U.S. PATENT DOCUMENTS

| 6,551,875 B2* | 4/2003 | Tsao .................... H01L 27/1087 |
| | | 438/243 |
| 9,324,838 B2 | 4/2016 | Cascino et al. |

(Continued)

FOREIGN PATENT DOCUMENTS

| DE | 112013005770 | 8/2015 |
| JP | 2008 235399 A2 | 10/2008 |
| KR | 10 2015 82460 A | 7/2015 |

*Primary Examiner* — Bitew A Dinke
(74) *Attorney, Agent, or Firm* — Design IP

(57) ABSTRACT

A semiconductor device and a method of manufacturing the same is provided. The semiconductor device including a transistor cell in a semiconductor substrate having a first main surface. The transistor cell includes a gate electrode in a gate trench in the first main surface adjacent to a body region. A longitudinal axis of the gate trench extends in a first direction parallel to the first main surface. A source region, a body region and a drain region are disposed along the first direction. A source contact comprises a first source contact portion and a second source contact portion. The second source contact portion is disposed at a second main surface of the semiconductor substrate. The first source contact portion includes a source conductive material in direct contact with the source region and a portion of the semiconductor substrate arranged between the source conductive material and the second source contact portion.

12 Claims, 26 Drawing Sheets

(51) Int. Cl.
*H01L 29/06* (2006.01)
*H01L 29/08* (2006.01)
*H01L 29/10* (2006.01)
*H01L 29/40* (2006.01)
*H01L 21/225* (2006.01)
*H01L 29/66* (2006.01)
*H01L 29/423* (2006.01)
*H01L 21/223* (2006.01)
*H01L 21/265* (2006.01)

(52) U.S. Cl.
CPC ...... *H01L 29/0865* (2013.01); *H01L 29/1079* (2013.01); *H01L 29/1083* (2013.01); *H01L 29/1087* (2013.01); *H01L 29/407* (2013.01); *H01L 29/4175* (2013.01); *H01L 29/41766* (2013.01); *H01L 29/4236* (2013.01); *H01L 29/66659* (2013.01); *H01L 29/66696* (2013.01); *H01L 29/66704* (2013.01); *H01L 29/7821* (2013.01); *H01L 29/7835* (2013.01); *H01L 21/223* (2013.01); *H01L 21/2236* (2013.01); *H01L 21/2255* (2013.01); *H01L 21/26586* (2013.01)

(58) Field of Classification Search
CPC ........... H01L 29/66659; H01L 29/4236; H01L 21/2254; H01L 29/1079; H01L 29/1087; H01L 29/7821; H01L 29/0865; H01L 29/0696; H01L 29/4175; H01L 29/66696; H01L 29/407; H01L 21/223; H01L 21/26586; H01L 21/2255; H01L 21/2236; H01L 21/38–388; H01L 21/225
See application file for complete search history.

(56) References Cited

U.S. PATENT DOCUMENTS

| | | | |
|---|---|---|---|
| 9,661,707 B2* | 5/2017 | Meiser | H01L 29/41766 |
| 9,735,243 B2 | 8/2017 | Meiser et al. | |
| 2002/0155685 A1 | 10/2002 | Sakakibara | |
| 2004/0089896 A1 | 5/2004 | Sakaibara | |
| 2006/0102947 A1* | 5/2006 | Wu | H01L 21/26506 257/306 |
| 2007/0034944 A1 | 2/2007 | Xu et al. | |
| 2007/0138548 A1 | 6/2007 | Kocon et al. | |
| 2008/0230801 A1 | 9/2008 | Murakoshi et al. | |
| 2008/0246081 A1* | 10/2008 | Li | H01L 29/1095 257/331 |
| 2008/0246086 A1 | 10/2008 | Korec et al. | |
| 2009/0212359 A1* | 8/2009 | Hsieh | H01L 29/1095 257/331 |
| 2009/0309156 A1* | 12/2009 | Darwish | H01L 29/7816 257/332 |
| 2010/0200915 A1* | 8/2010 | Denison | H01L 29/42368 257/335 |
| 2011/0254088 A1* | 10/2011 | Darwish | H01L 29/407 257/340 |
| 2011/0278671 A1 | 11/2011 | Lin et al. | |
| 2014/0015048 A1* | 1/2014 | Ng | H01L 29/407 257/335 |
| 2014/0048878 A1 | 2/2014 | Xiao | |
| 2014/0084362 A1 | 3/2014 | Schlosser et al. | |
| 2014/0151798 A1* | 6/2014 | Meiser | H01L 29/7816 257/339 |
| 2014/0197486 A1* | 7/2014 | Kocon | H01L 27/088 257/337 |
| 2014/0339633 A1 | 11/2014 | Meiser et al. | |
| 2015/0091083 A1* | 4/2015 | Poelzl | H01L 29/407 257/330 |
| 2015/0137224 A1* | 5/2015 | Meiser | H01L 29/4175 257/331 |
| 2015/0187761 A1* | 7/2015 | Irsigler | H01L 21/225 257/334 |
| 2016/0181413 A1 | 6/2016 | Fujita | |
| 2016/0308044 A1* | 10/2016 | Meiser | H01L 29/063 |
| 2016/0322347 A1* | 11/2016 | Meiser | H05B 33/083 |
| 2016/0365443 A1* | 12/2016 | Meiser | H01L 29/0696 |
| 2017/0221885 A1* | 8/2017 | Sander | H01L 27/088 |
| 2017/0236931 A1* | 8/2017 | Meiser | H01L 23/34 257/334 |
| 2018/0026133 A1* | 1/2018 | Meiser | H01L 29/0653 257/335 |

* cited by examiner

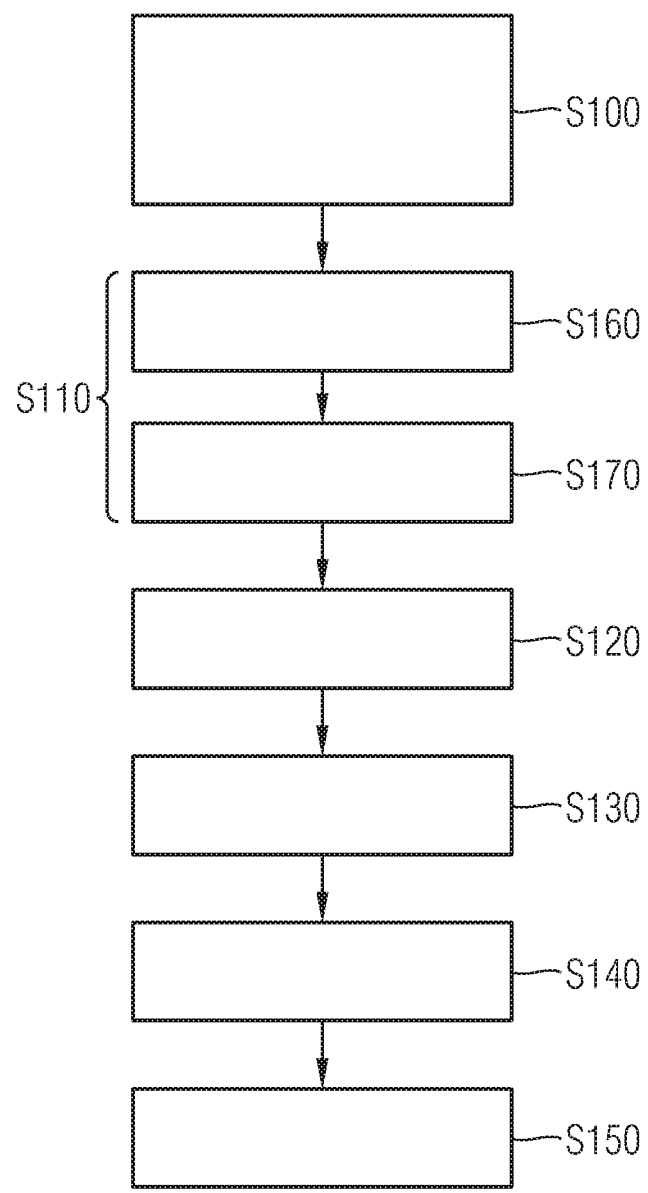

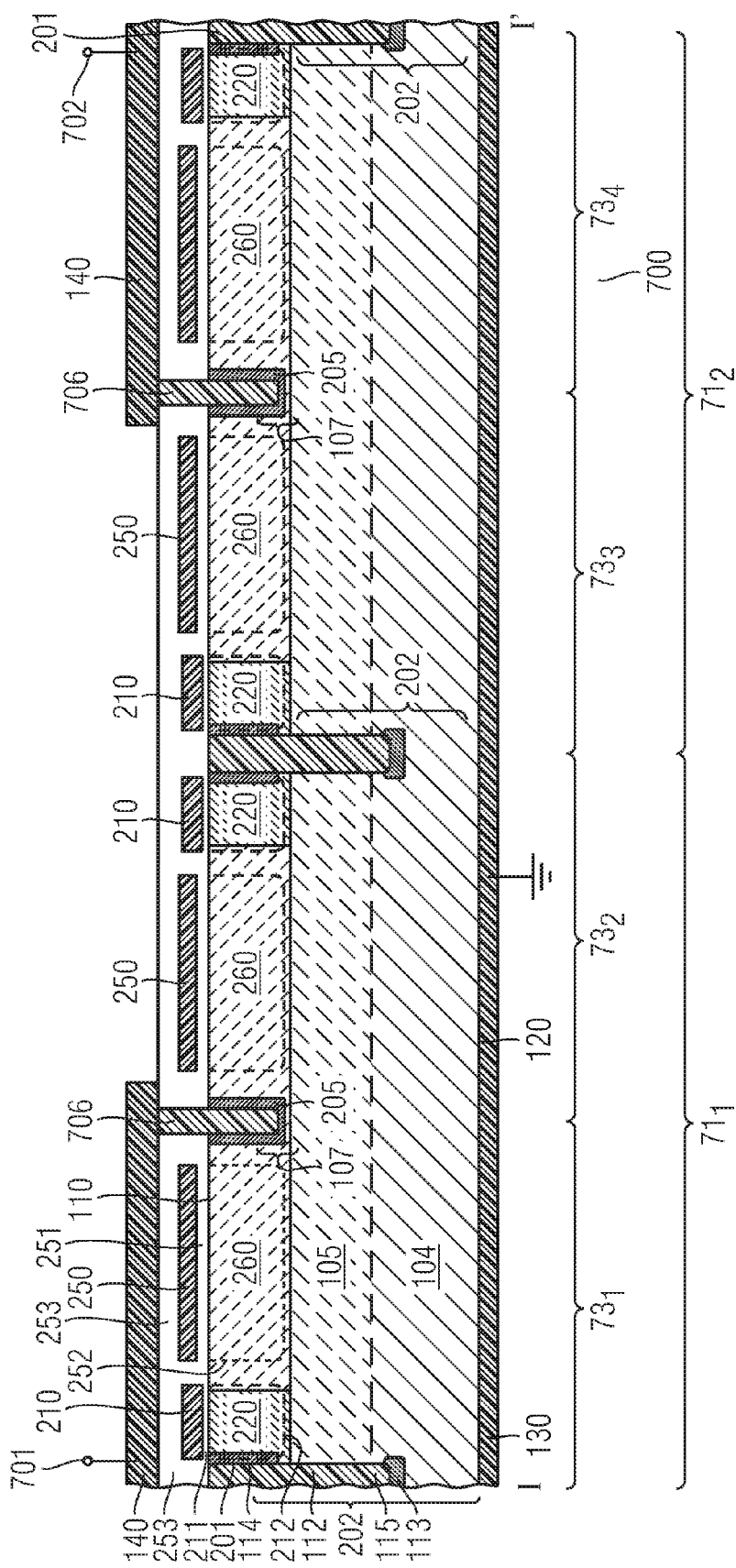

SEMICONDUCTOR DEVICE COMPRISING A TRANSISTOR CELL INCLUDING A SOURCE CONTACT IN A TRENCH, METHOD FOR MANUFACTURING THE SEMICONDUCTOR DEVICE AND INTEGRATED CIRCUIT

CROSS REFERENCE TO RELATED APPLICATIONS

This application is a divisional of U.S. patent application Ser. No. 15/234,520 filed on Aug. 11, 2016, which claims the benefit of German Patent Application No. 10 2015 113 494.2 filed on Aug. 14, 2015 and German Patent Application No. 10 2016 107 714.3 filed on Apr. 26, 2016, which are incorporated by reference as if fully set forth.

BACKGROUND

Power transistors commonly employed in automotive and industrial electronics should have a low on-state resistance ($R_{on} \cdot A$), while securing a high voltage blocking capability. For example, a metal oxide semiconductor (MOS) power transistor should be capable, depending upon application requirements, to block to drain to source voltages $V_{ds}$ of some tens to some hundreds or thousands volts. MOS power transistors typically conduct very large currents which may be up to some hundreds of amperes at typical gate-source voltages of about 2 to 20 V.

A concept for transistors having a further improved $R_{on} \cdot A$ characteristic refers to lateral power trench metal oxide semiconductor field effect transistor (MOSFET). Lateral power trench MOSFETs utilize more bulk silicon for reducing $R_{on}$ so that $R_{on}$ is comparable to that of a vertical trench MOSFET. In transistors comprising a lateral field plate, the doping concentration of the drift zone may be increased, due to the compensation action of the field plate.

Further developments are being made to improve the characteristics of such a lateral power trench MOSFET. Further, investigations are made to develop a lateral power trench MOSFET which may be contacted from the top side and the back side to implement a vertical device.

SUMMARY

According to an embodiment, a semiconductor device includes a transistor cell in a semiconductor substrate having a first main surface. The transistor cell comprises a source region, a source contact electrically connected to the source region, the source contact including a first source contact portion and a second source contact portion, a drain region, a body region, and a gate electrode in a gate trench in the first main surface adjacent to the body region. The gate electrode is configured to control a conductivity of a channel in the body region. A longitudinal axis of the gate trench extends in a first direction parallel to the first main surface. The source region, the body region and the drain region are disposed along the first direction. The second source contact portion is disposed at a second main surface of the semiconductor substrate. The first source contact portion includes a source conductive material in direct contact with the source region and a portion of the semiconductor substrate arranged between the source conductive material and the second source contact portion.

According to an embodiment, a method of manufacturing a semiconductor device including a transistor cell in a semiconductor substrate having a first main surface includes forming a source region, forming a source contact electrically connected to the source region, forming a drain region, forming a body region, and forming a gate electrode in a gate trench. The gate electrode is configured to control a conductivity of a channel formed in the body region. The source region, the body region and the drain region are disposed along a first direction, the first direction being parallel to the first main surface. Forming the source contact includes forming a source contact groove in the first main surface of the semiconductor substrate to a depth larger than a depth of the gate trench and performing a doping process to introduce dopants of a second conductivity type through a first portion of a sidewall of the source contact groove and to introduce dopants of a first conductivity type through a second portion of the sidewall of the source contact groove.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments described herein and are incorporated in and constitute a part of this specification. The drawings illustrate embodiments and together with the description serve to explain the principles of the disclosure. Other embodiments and many of the intended advantages will be readily appreciated, as they become better understood by reference to the following detailed description. The elements of the drawings are not necessarily to scale relative to each other. Like reference numbers designate corresponding similar parts.

FIG. 5 summarizes a method according to an embodiment;

FIG. 7A shows a cross-sectional view of an example of an integrated circuit according to an embodiment;

DETAILED DESCRIPTION

Figure 1A:
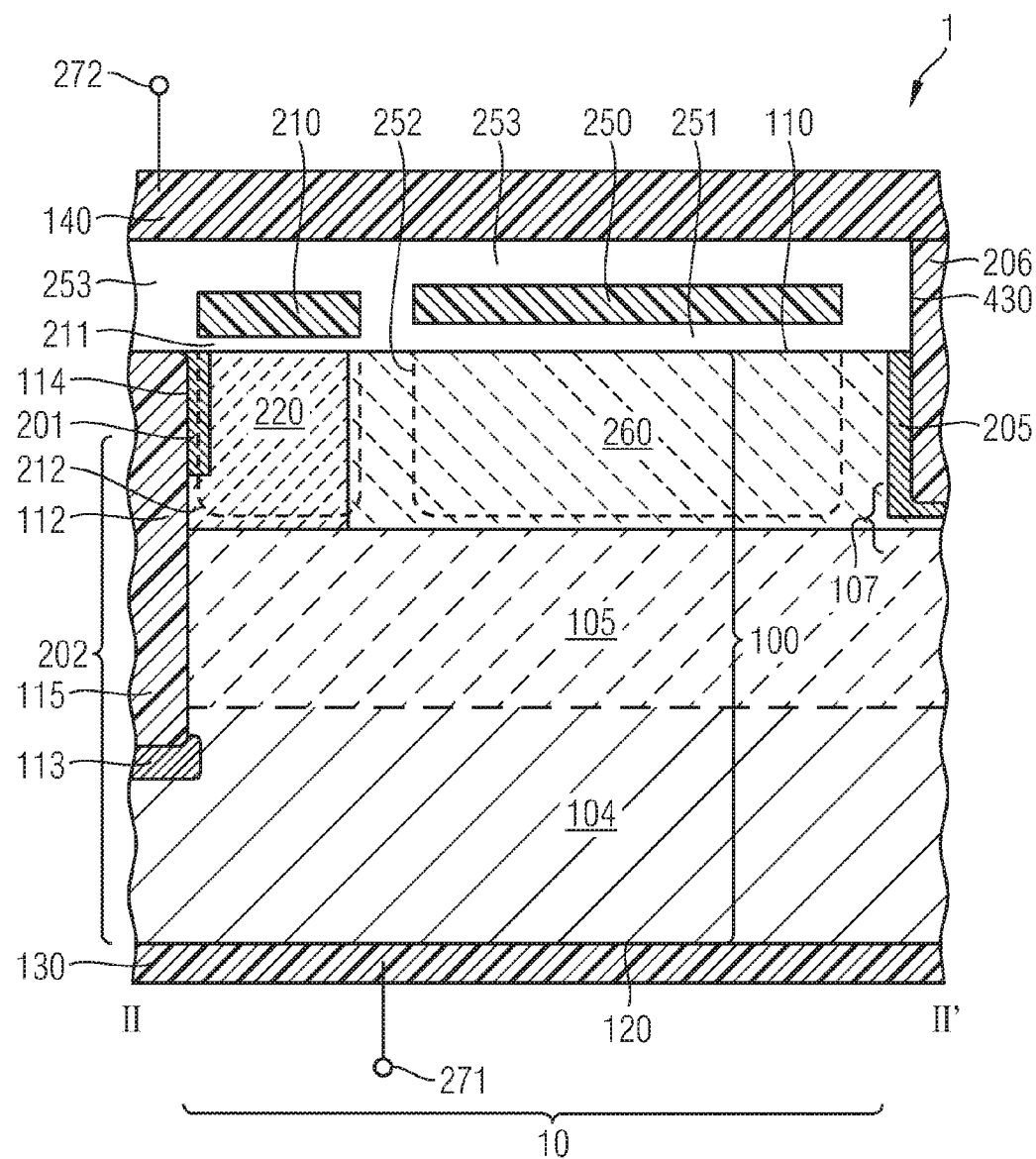
FIGS. 1A to 1E show various views of a semiconductor device comprising a transistor cell according to an embodiment.

In the following detailed description reference is made to the accompanying drawings, which form a part hereof and in which are illustrated by way of illustration specific embodiments. In this regard, directional terminology such as "top", "bottom", "front", "back", "leading", "trailing" etc. is used with reference to the orientation of the Figures being described. Since components of embodiments can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

The present specification refers to a "first" and a "second" conductivity type of dopants, semiconductor portions are doped with. The first conductivity type may be p type and the second conductivity type may be n type or vice versa. As is generally known, depending on the doping type or the polarity of the source and drain regions, insulated gate field effect transistors (IGFETs) such as metal oxide semiconductor field effect transistors (MOSFETs) may be n-channel or p-channel MOSFETs. For example, in an n-channel MOSFET, the source and the drain region are doped with n-type dopants. In a p-channel MOSFET, the source and the drain region are doped with p-type dopants. As is to be clearly understood, within the context of the present specification, the doping types may be reversed. If a specific current path is described using directional language, this description is to be merely understood to indicate the path and not the polarity of the current flow, i.e. whether the current flows from source to drain or vice versa. The Figures may include polarity-sensitive components, e.g. diodes. As is to be clearly understood, the specific arrangement of these polarity-sensitive components is given as an example and may be inverted in order to achieve the described functionality, depending whether the first conductivity type means n-type or p-type.

The Figures and the description illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

The terms "wafer", "substrate", "semiconductor substrate" or "semiconductor body" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

FIG. 1A shows a cross-sectional view of a semiconductor device according to an embodiment. The cross-sectional view of FIG. 1A is taken between II and II', as is also illustrated in FIG. 1C. The semiconductor device 1 shown in FIG. 1A comprises a transistor cell 10 in a semiconductor substrate 100 having a first main surface 110. The transistor cell 10 comprises a source region 201, a source contact 202 electrically connected to the source region 201, a drain region 205, a body region 220, a drift zone 260 and a gate electrode 210. The gate electrode 210 is disposed in a gate trench 212 (indicated by broken lines) in a plane before and behind the drawing plane. The gate electrode 210 is configured to control a conductivity of a channel in the body region 220. A longitudinal axis of the gate trench 212 extends in a first direction parallel to the first main surface 110, e.g. the x-direction. The body region 220 and the drift zone 260 are disposed along the first direction between the source region 201 and the drain region 205. The source contact comprises a first contact portion 202 and a second source contact portion 130. The second source contact portion 130 is disposed at a second main surface 120 of the semiconductor substrate 100, opposite to the first main surface 110. For example, the second source contact portion 130 may implement a source contact layer which may be a source or back side metallization layer. The first source contact portion 202 comprises a source conductive material 115 in direct contact with the source region 201 and a portion 104 of the semiconductor substrate 100 arranged between the source conductive material 115 and the second source contact portion 130.

For example, the source conductive material 115 may comprise several elements that are electrically connected. The term "arranged between" is intended to mean that the portion of the semiconductor substrate is lying at an intervening position between the source conductive material 115 and the second source contact portion. Further elements may be disposed between the second source contact portion and the portion of the semiconductor substrate or between the portion of the semiconductor substrate and the first source contact portion. This term may further comprise the meaning that at least two of the source conductive material, the portion 104 of the semiconductor substrate 100 and the second source contact portion 130 may horizontally overlap. In more detail, there may be at least one horizontal region in which the portion 104 of the semiconductor substrate 100 and the second source contact portion 130 are stacked one over the other so that they horizontally overlap. Further or alternatively, there may be at least one horizontal region in which the portion 104 of the semiconductor substrate 100 and the source conductive material 115 are stacked one over the other so that they horizontally overlap. The source conductive material 115 may horizontally overlap with the second source contact portion 130. According to a further embodiment, the source conductive material 115 does not horizontally overlap with the second source contact portion 130.

The source conductive material 115 may extend in the semiconductor substrate 100 to a depth larger than a depth of the gate trench 212. In the embodiment illustrated in FIG. 1A, the semiconductor substrate 100 comprises a first portion 104 on a side of the back side or the second main surface 120 of the substrate. The first portion 104 may comprise a heavily doped portion of the first conductivity type, e.g. p+. The first portion 104 forms a planar layer. A doping concentration of the first portion 104 may vary from a side at the second main surface 120 to a side remote from the second main surface 120. A layer 105 of the first conductivity type at a lower doping concentration is layered over the first portion 104. The layer 105 may form a second portion.

The drift zone 260 which may be of the second conductivity type may be formed in direct contact with the second portion 105 of the first conductivity type. For example, the material of the second conductivity type in which the drift zone 260 is formed may be epitaxially formed over the second portion 105 of the first conductivity type. According to a further example, the drift zone 260 having the second conductivity type may be doped by an ion implantation process. Further, the body region 220 is formed over the second portion 105. The body region 220 may be doped with the first conductivity type. The source region 201 may be of the second conductivity type and is disposed so as to extend into the semiconductor substrate 100. For example, the source region 201 may form a part of a sidewall 114 of a source contact groove 112 in the semiconductor substrate 100. The source region 201 and the drain region 205 may be formed adjacent to the first main surface 110 of the semiconductor substrate 100.

The source contact groove 112 may be formed in the semiconductor substrate 100 from the first main surface 110 so as to extend into the depth direction, e.g. the z direction of the substrate 100. The depth of the source contact groove 112 may be larger than a depth of the gate trench 212. The depth of the source contact groove may be approximately 3 to 20 μm, e.g. 4 μm. For example, the source contact groove 112 may extend to the first portion 104 of the semiconductor substrate, the first portion 104 having the higher doping concentration. A doped portion 113 of the first conductivity type at a higher doping concentration than the doping concentration of the first substrate portion 104 may be disposed beneath the source contact groove 112. The heavily doped portion 113 may implement a contact portion. According to a further embodiment, the source contact groove may extend to the second portion 105 of the substrate and may not extend to the first portion 104. The electrical contact to the first portion 104 may be implemented by the contact portion 113 arranged between the source contact groove 112 and the first portion 104. An insulating material 253 may be formed over the first main surface 110 of the semiconductor substrate so that the source contact 202 is disconnected from the top surface of the semiconductor device.

According to the embodiment shown in FIG. 1A, the source region 201 is electrically connected to a source contact layer or second source contact portion 130 disposed on the second main surface 120 of the semiconductor substrate 100 by means of the first source contact portion 202 that comprises a source conductive material 115 in the source contact groove and the first portion 104 of the semiconductor substrate. As a result, the source contact implements a vertical contact to the back side of the semiconductor device 1 by means of a low resistive source conductive material 115 which is filled in the source contact groove 112. The source conductive material 115 may comprise a metal such as tungsten. The second source contact portion 130 may be electrically connected to a source terminal 271.

Due to the feature that the source conductive material 115 deeply extends into the semiconductor substrate, e.g. to the first portion 104 of the semiconductor substrate, a parasitic bipolar transistor may be deteriorated or suppressed. In more detail, the heavily doped portion 104 suppresses a transistor, e.g. the npn transistor which could otherwise be formed in this region. This effect may also be achieved when the source conductive material 115 extends into the second portion 105 of the semiconductor substrate, and the contact portion 113 is disposed between the source conductive material 115 and the first portion 104. Due to the presence of the source conductive material 115 deeply extending into the semiconductor substrate 100, e.g. to the first portion 104 or to the second portion 105, arrangements of adjacent transistors cells may be insulated.

Generally, power transistors comprise a plurality of basic transistor cells in the manner as is described herein with reference to the figures shown. The single transistor cells may be connected parallel to each other and share common source, drain, and gate terminals. Further, depending on the specific implementation, the single transistor cells of the transistors may share common source and drain regions. For example, a plurality of parallel transistor cells may be arranged along a second direction, e.g. the y-direction, and may be connected in parallel to form a transistor. Further transistor cells of the transistor may be disposed in a mirrored manner with respect to the drain region. In the context of the present specification, the term "semiconductor device" may refer to the transistor cell 10 or may refer to a transistor comprising a plurality of transistor cells.

For example, as will be discussed with reference to FIG. 7A, pairs of adjacent transistor cells may be arranged in a mirrored manner so that they share a common drain contact 706. Further, the first source contact portions 202 of the pairs may be arranged at opposing sides of the adjacent transistor cells. In this case, adjacent transistors may be effectively insulated from each other by the source conductive material 115 extending in the semiconductor substrate.

The drain contact 206 is disposed in a drain contact groove 430 in the semiconductor substrate. A depth of the drain contact groove may be approximately 0.2 to 20 μm, e.g. 1.0 μm. The drain region 205 which may be of the second conductivity type is electrically connected to the drain contact 206. The drain contact 206 extends to the top side of the semiconductor device. A drain contact layer 140, e.g. a drain metallization layer is disposed on the top side of the semiconductor device. The drain contact layer 140 may be electrically connected to a drain terminal 272.

Examples of the source conductive material 115 and the material of the drain contact, e.g. a drain conductive material comprise metals such as tungsten and polysilicon. Examples of the materials of the second source contact portion 130 and the drain contact layer 140 comprise metals such as tungsten. As is to be readily appreciated, these materials are merely given as examples and different materials may be used.

As is further shown in FIG. 1A, according to an embodiment, an avalanche clamping diode may be formed adjacent to the drain contact 206. In more detail, the drain region 205 of the second conductivity type, and the second portion 105 of the first conductivity type of the semiconductor substrate form a pn diode 107 which may cause an avalanche breakdown in case of a breakdown of the semiconductor device in order to avoid an avalanche breakdown in the drift region, which may lead to a drift of the device parameters. Thereby, the characteristics of the device characteristics of the device are improved. By setting a thickness of the respectively doped portions and by setting a doping concentration of the doped portions, the breakdown voltage may be adjusted.

The semiconductor device 10 may further comprise a field plate 250. According to an embodiment, the field plate 250 may be implemented as a planar field plate that is disposed over the first main surface 110 of the semiconductor substrate. According to a further embodiment, the field plate may be arranged in a field plate trench 252 that extends in the semiconductor substrate. The field plate 250 may be insulated from the drift zone 260 by means of a field dielectric layer 251. The gate electrode 210 is insulated from the body region 220 by means of the gate dielectric layer 211.

Figure 1B:
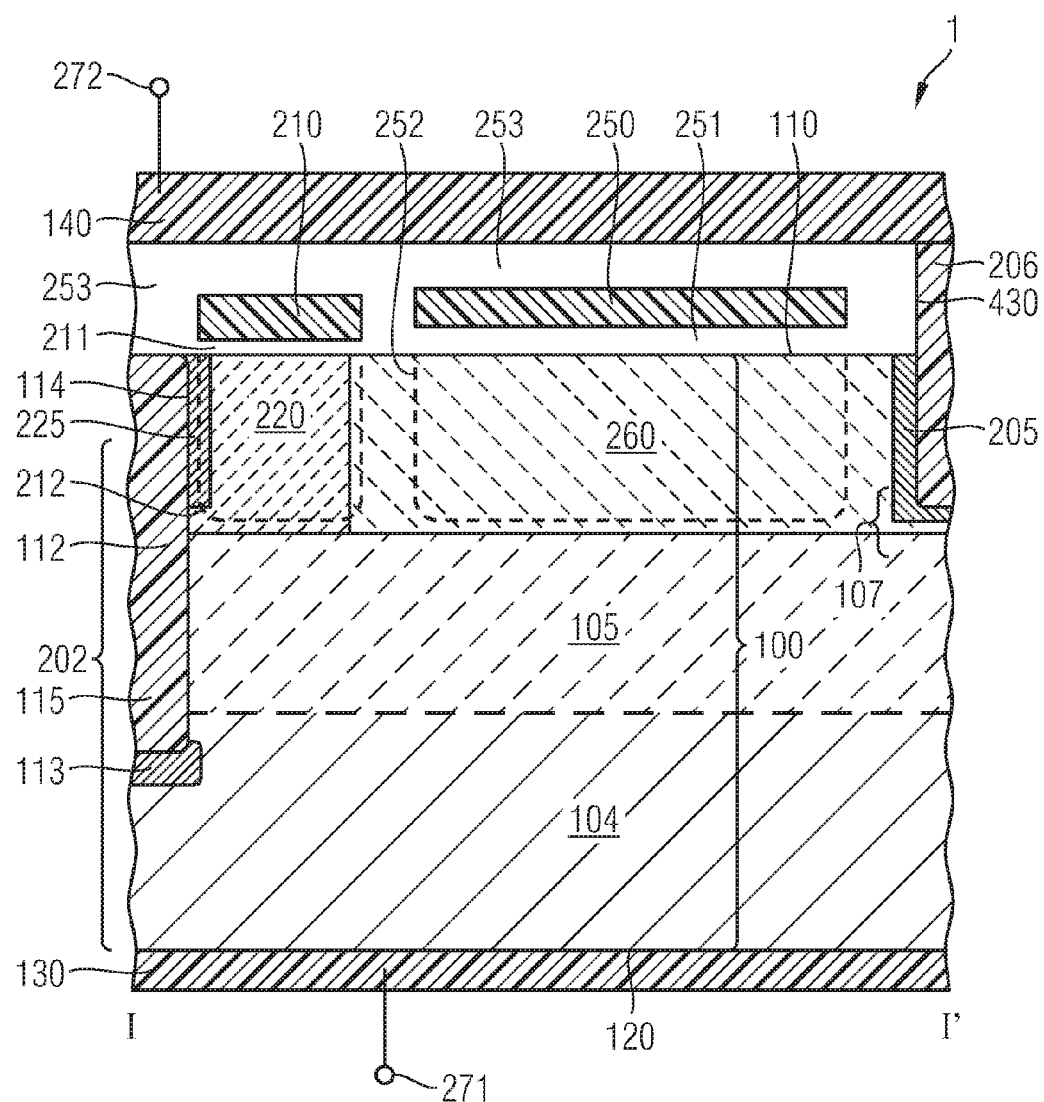
Figure 1C:
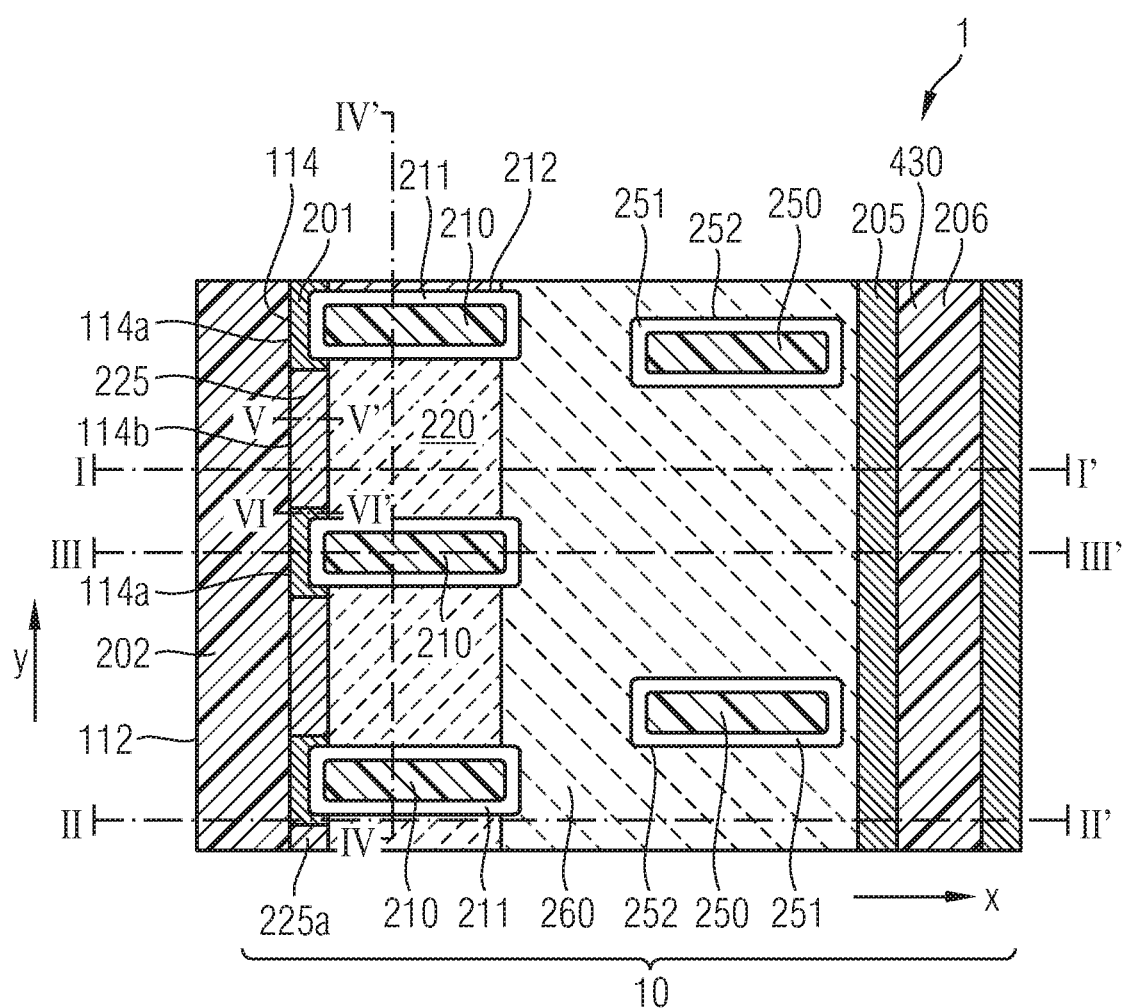

FIG. 1B shows a cross-sectional view of the semiconductor device shown in FIG. 1A, the cross-sectional view being taken at a position which is shifted along a second direction perpendicular to the first direction. The cross-sectional view of FIG. 1B is taken between I and I', as is also illustrated in FIG. 1C. The cross-sectional view of FIG. 1B is taken so as to intersect a second portion 114b of the sidewall 114 of the source contact groove 112. Differing from the cross-sectional view shown in FIG. 1A, a body contact portion 225 is formed adjacent or in the second portion 114b of the sidewall of the source contact groove 112. Accordingly, the body contact portion 225 vertically overlaps with the source region 201. The wording "vertically overlaps with" is intended to mean that the respective portions or regions may extend in the same depth. In more detail, there may be a vertical extension of the semiconductor body at which the respective portions or regions may be present. To be more specific, the starting points of the respective portions or regions do not need to coincide. Further, the end points of the respective portions or regions do not need to coincide. The body contact portion 225 is electrically connected to the source contact 202.

Due to the presence of the body contact portion 225 and, in particular due to the feature that the body contact portion 225 vertically overlaps with the source region 201, the suppression of a parasitic bipolar transistor may be improved. In more detail, holes may be efficiently removed from the body region, thereby preventing detrimental effects such as a snap-back effect. This results in an improved safe-operating area (SOA) that corresponds to a region in the I-V-characteristic in which the semiconductor device may be safely operated.

FIG. 1C shows a horizontal cross-sectional view of the semiconductor device illustrated in FIGS. 1A and 1B. As is shown, the semiconductor device 1 comprises a source contact groove 112 and a drain contact groove 430. The source contact groove 112 and the drain contact groove 430 extend in a second direction (e.g. the y direction) which is perpendicular to the first direction. The source contact groove 112 and/or the drain contact groove need not have strictly vertical sidewalls In more detail, the sidewalls may also be inclined or rounded. For example, the source contact groove 112 and/or the drain contact groove may be tapered. The semiconductor device further comprises gate trenches 212 that are formed in the first main surface 110 of the semiconductor device and field plate trenches 252. A longitudinal axis of the gate trenches 212 and the field plate trenches 252 may extend in the first direction. The term "longitudinal axis" refers to a horizontal axis along which the respective trench has a greater extension length than in another horizontal direction. The gate trenches 212 pattern the body region 220 into a plurality of segments, e.g. ridges or fins.

The sidewall 114 of the source contact groove 112 may be segmented into first portions 114a and second portions 114b. The source region 201 may be disposed adjacent to or in first portions 114a of the sidewall. Further, the body contact portion 225 may be disposed adjacent to or in second portions 114b of the sidewall 114. The distance between adjacent gate trenches 212 may be different from a distance between adjacent field plate trenches 252. A portion of the gate electrode 210 may be disposed over the first main surface 110 of the semiconductor substrate and may extend in the second direction. Further, a portion of the field plate 250 may be disposed over the first main surface 110 of the semiconductor substrate and may extend in the second direction.

Figure 1D:
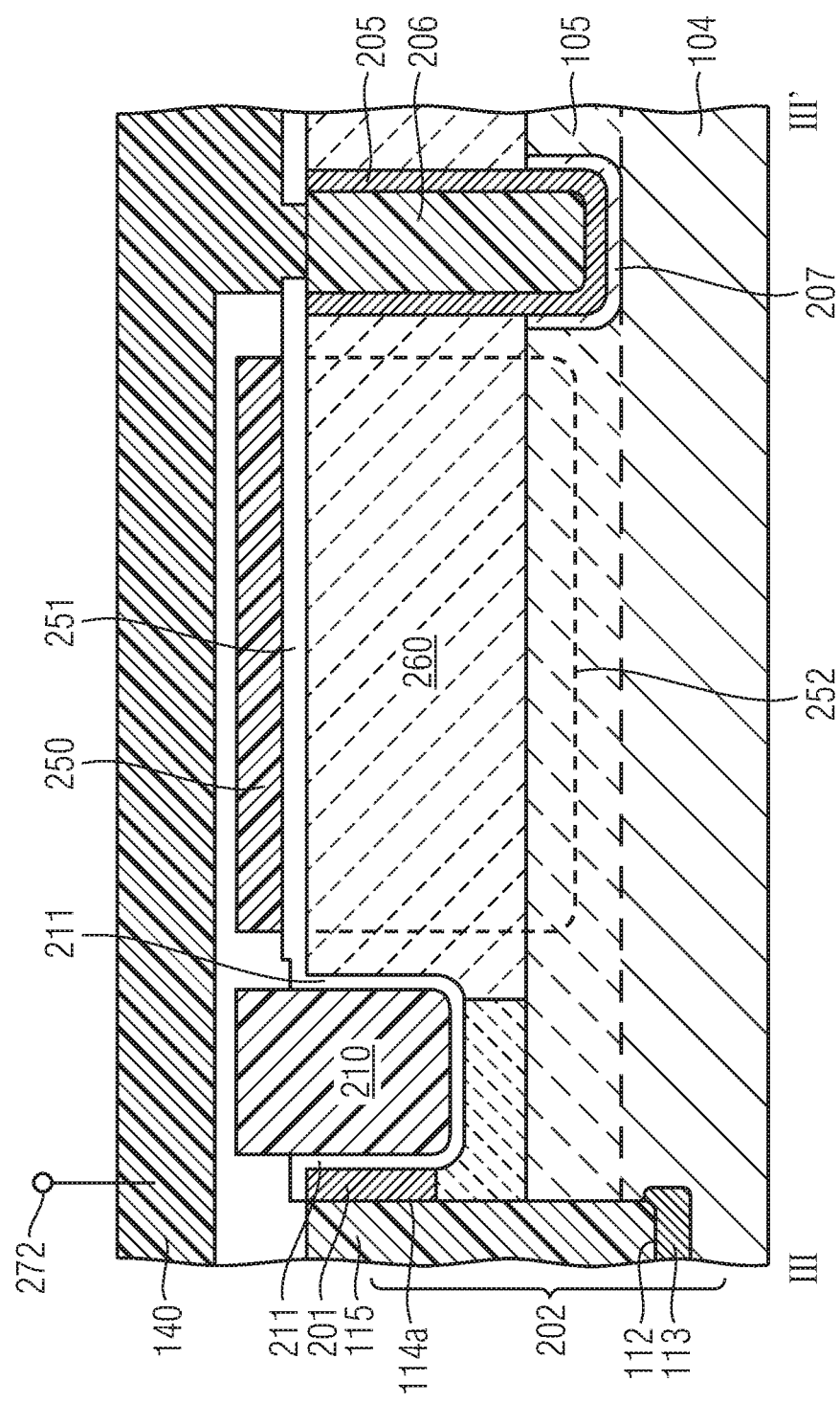

FIG. 1D shows a cross-sectional view of the semiconductor device shown in FIGS. 1A to 1C, the cross-sectional view being taken at a position so as to intersect the gate trenches 212. The cross-sectional view of FIG. 1D is taken between III and III', as is also illustrated in FIG. 1C. The cross-sectional view of FIG. 1D shows the same components as FIGS. 1A and 1B. Further, the gate trench 212 extends in the semiconductor substrate 110 in the depth direction. FIG. 1D further shows modifications of the embodiment illustrated in FIGS. 1A to 1C. Differing from the structures shown in FIGS. 1A to 1C, the field plate trench 252 (indicated by broken lines and being disposed before and behind the depicted plane of the drawing) may extend to the second portion 105 of the semiconductor substrate. For example, the field plate trench 252 may extend to a depth that is deeper than the depth of the drift zone 260. As a result, the field plate 250 may vertically overlap with the second portion 105 of the semiconductor substrate having the first conductivity type.

According to a further modification, that may be independent from the depth of the field plate trench 252, the drain contact groove 430 may extend to the second portion 105 of the semiconductor substrate. As a result, the drain contact 206 may vertically overlap with the second portion 105 of the semiconductor substrate having the first conductivity type. For example, a semiconductor portion of the second conductivity type may be disposed adjacent to the drain contact 206. As is illustrated in FIG. 1D, the drain region 205 may be disposed between the drain contact 206 and adjacent semiconductor material. A further doped portion 207 of the second conductivity type may be disposed adjacent to the drain contact 106 in a region of the second portion 105 of the semiconductor substrate. For example, the further doped portion 207 may be doped at a lower doping concentration than the drain region 205. According to an embodiment, the further doped portion 207 may be in direct contact with a portion of the drain contact 206, or the drain region 205 may be disposed between the further doped portion 207 and the drain contact 206. The doped portion of the second conductivity type and the second portion 105 of the first conductivity type implement an avalanche clamping diode as has been explained above.

Figure 1E:
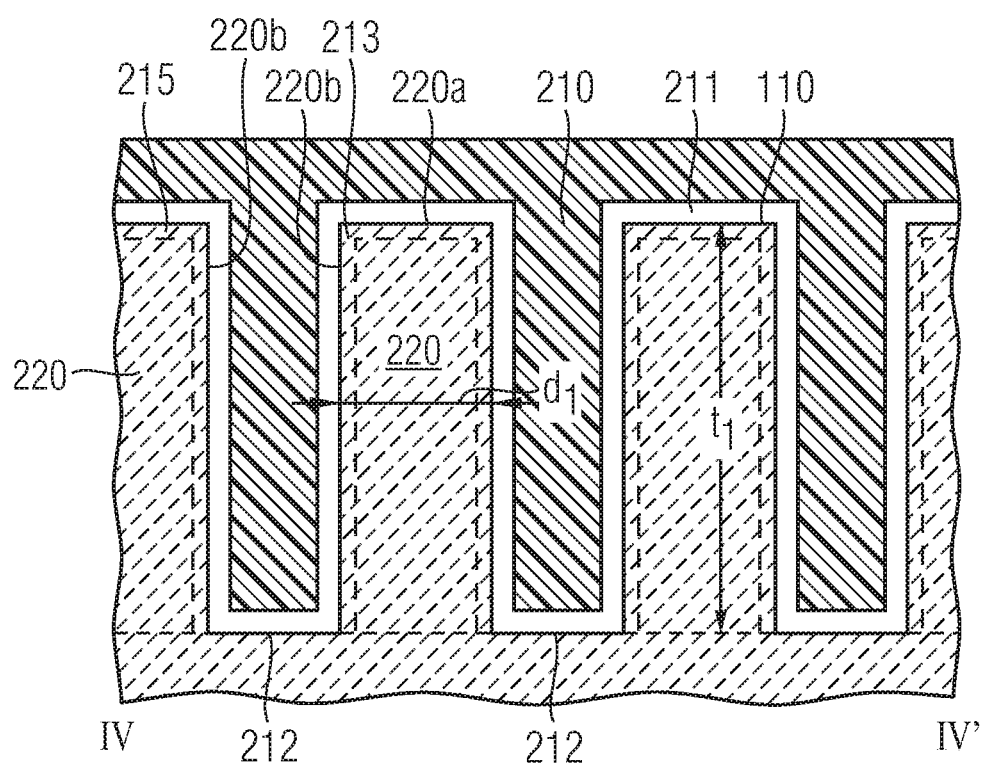

FIG. 1E shows a cross-sectional view which is taken along the second direction. The cross-sectional view of FIG. 1E is taken between IV and IV' as is illustrated in FIG. 1C so as to intersect a plurality of gate trenches 212. Portions of semiconductor material 220 forming the single ridges or fins may be patterned by adjacent gate trenches 212. The ridges comprise a top surface 220a and sidewalls 220b. A gate dielectric layer 211 is disposed adjacent to the sidewalls 220b and the top surface 220a of each of the ridges. A conductive material is filled in the trenches 212 between adjacent ridges to form the gate electrode 210. As a result, the body region 220 has the shape of a ridge extending in the first direction. Differently stated, a longitudinal axis of the ridges or the fins corresponds to the first direction.

The sidewalls 220b may extend perpendicularly or at an angle of more than 75° with respect to the first main surface 110. The gate electrode 210 may be disposed adjacent to at least two sides of the ridge.

When the transistor is switched on, e.g. by applying as suitable voltage to the gate electrode 210, a conductive inversion layer 213 (conductive channel) is formed at the boundary between the body region 220 and the gate dielectric layer 211. Accordingly, the field effect transistor is in a conducting state from the source region 201 to the drain region 205. In case of switching off, no conductive inversion layer is formed and the transistor is in a non-conducting state. According to an embodiment, the conductive channel regions 213 formed at opposing sidewalls 220b of a ridge do not merge with each other so that the body region 220 may not be fully depleted and may be connected to the source region and to the body contact region 225.

For example, a distance between adjacent gate trenches 212 that corresponds to a width d1 of the ridges may be larger than 200 nm, e.g. 200 to 2000 nm, for example, 400 to 600 nm. The transistor may further comprise a field plate. When the transistor is switched off, e.g. by applying a corresponding voltage to the gate electrode, carriers may be depleted from the drift zone. As a result, a doping concentration of the drift zone may be increased while maintaining the blocking capability of the transistor. As a result, the on-state resistance may be further reduced, while securing the high voltage blocking capability.

According to a further embodiment, the width d1 of the body region 220 fulfils the following relationship: $d1 \leq 2*I_d$, wherein $I_d$ denotes a length of a depletion zone which is formed at the interface between the gate dielectric layer 211 and the body region 220. For example, the width of the depletion zone may be determined as:

$$I_d = \sqrt{\frac{4\varepsilon_s kT \ln(N_A/n_i)}{q^2 N_A}}$$

wherein $\varepsilon_s$ denotes the permittivity of the semiconductor material ($11.9 \times \varepsilon_0$ for silicon, $\varepsilon_0 = 8.85 \times 10^{-14}$ F/cm), k denotes the Boltzmann constant ($1.38066 \times 10^{-23}$ J/k), T denotes the temperature (e.g. 300 K), ln denotes the natural logarithm, $N_A$ denotes the impurity concentration of the semiconductor body, $n_i$ denotes the intrinsic carrier concentration ($1.45 \times 10^{10}$ cm$^{-3}$ for silicon at 27° C.), and q denotes the elementary charge ($1.6 \times 10^{-19}$ C).

Generally, the length of the depletion zone varies depending from the gate voltage. It is assumed that in a transistor the length of the depletion zone at a gate voltage corresponding to the threshold voltage corresponds to the maximum width of the depletion zone. For example, the width of the first ridges may be approximately 10 to 200 nm, for example, 20 to 60 nm along the main surface 110 of the semiconductor substrate 100.

According to the embodiment in which the width $d1 \leq 2*Id$, the transistor is a so-called "fully-depleted" transistor in which the body region 220 is fully depleted when the gate electrode 210 is set to an on-voltage. In such a transistor, an optimal sub-threshold voltage may be achieved and short channel effects may be efficiently suppressed, resulting in improved device characteristics.

In the field effect transistor cell 10 illustrated in FIGS. 1A to 1E the gate electrode 210 is disposed in a gate trench 212 in the first main surface 110, the source region 201 vertically extends into the semiconductor substrate 100, and the drain region 205 vertically extends in the semiconductor substrate 100. As a result, the effective channel width and the volume of the drain extension of the transistor cell may be largely increased, thereby reducing the on-state resistance. Due to the fact that the source contact 202 comprises a portion 104 of the semiconductor substrate 100 and the source conductive material 115 in direct contact with the source region 201 and extends in the semiconductor substrate to a depth larger than a depth of the gate trench, a vertical semiconductor device may be implemented. Due to the presence of the body contact portion 225, the safe-operating area of the transistor may be further improved.

According to a further interpretation, the semiconductor device 1 illustrated in FIGS. 1A to 1E comprises a transistor cell 10 in a semiconductor substrate 100 having a first main surface 110. The transistor cell 10 comprises a source region 201, a source contact groove 112, a drain region 205, a body region 220, a drift zone 260, and a gate electrode 210 in a gate trench 212 in the first main surface 110 adjacent to the body region 220. The gate electrode 210 is configured to control a conductivity of a channel in the body region 220. The body region 220 and the drift zone 260 are disposed along a first direction between the source region 201 and the drain region 205, the first direction being parallel to the first main surface 110. The source contact groove 112 extends in a second direction perpendicular to the first direction. A conductive material 115 in the source contact groove 112 is electrically connected to the source region 201, the source contact groove 112 extending into the semiconductor substrate 100 to a depth larger than a depth of the gate trench 212. A semiconductor material at a first portion 114a of a sidewall of the source contact groove 112 is doped with dopants of a second conductivity type, and a semiconductor material at a second portion 114b of the sidewall 114 of the source contact groove 112 is doped with dopants of a first conductivity type.

The semiconductor device 1 illustrated with reference to FIGS. 1A to 1E comprises a plurality of single transistor cells 10 which may be connected in parallel. The pattern of the single transistor cells 10 may be repeated and mirrored along the first and the second directions. As is specifically illustrated in FIGS. 1A, 1B, and 1C, parallel transistor cells may be connected to a second source contact portion 130 (e.g. a common back side metallization layer) which is formed adjacent to the second main surface of the semiconductor substrate 100. Moreover, several transistors each comprising a plurality of transistor cells 10 may be connected to a second source contact portion 130 (e.g. the common back side metallization layer) which is formed adjacent to the second main surface of the semiconductor substrate 100. Further, the drain portions 205 of adjacent transistor cells 10 may be connected to a common drain contact layer 140 that is disposed on a side of the first main surface 110 of the semiconductor substrate 100. Accordingly, no specific patterning of the metallization layer is necessary for contacting transistor cells of the single transistors. As a result, the manufacturing process may be further simplified and cost may be reduced. The gate electrode 210 may be electrically connected from a side of the semiconductor device 10. The field plate 250 may be, e.g. connected to the source terminal 271.

FIGS. 2A to 2E illustrate a method of performing a doping process so as to introduce dopants of different conductivity types through different portions of the sidewall 114 of the source contact groove 112. This method may be useful for manufacturing a semiconductor device which may comprise semiconductor portions of different conductivity types at the sidewall of the source groove 112.

Figure 2A:
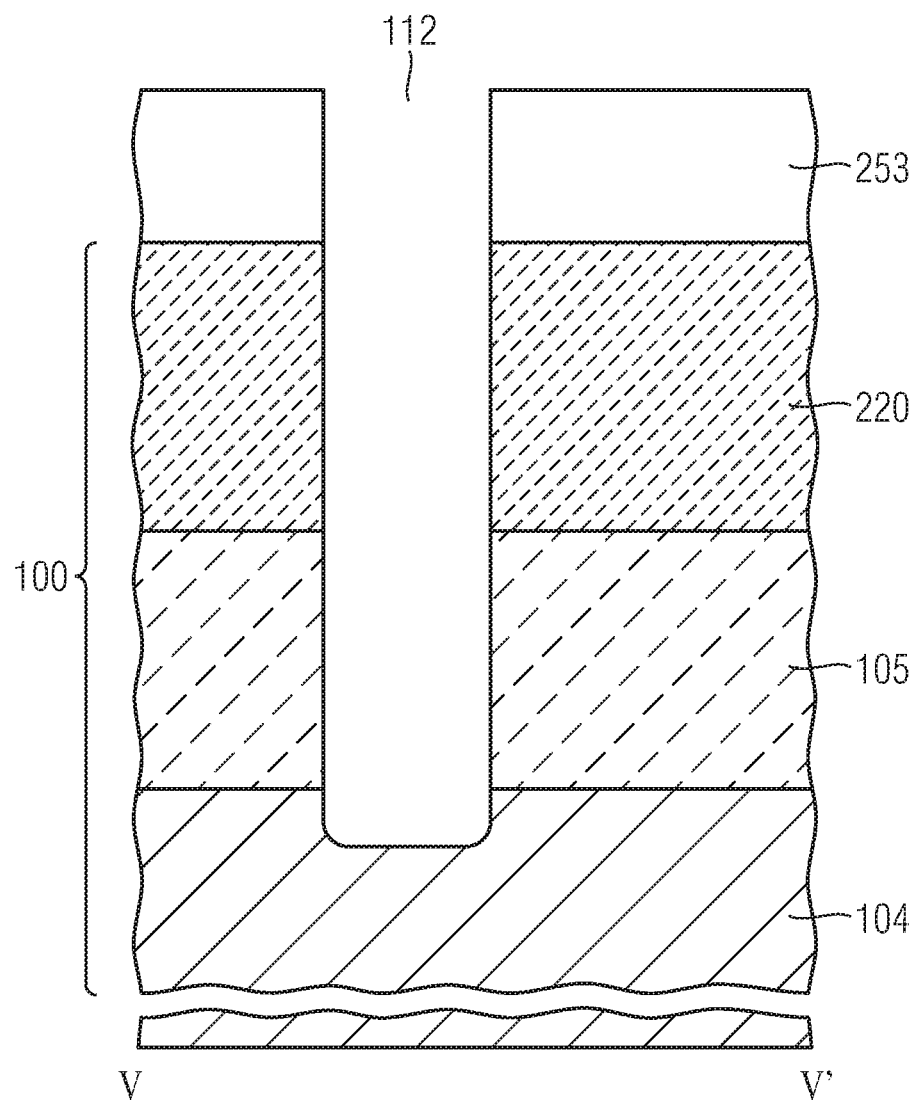
FIGS. 2A to 2F show cross-sectional views of a semiconductor substrate when performing a method according to an embodiment.

FIG. 2A shows a source contact groove 112 formed in a semiconductor substrate 100. The semiconductor substrate 100 comprises a first portion 104 of the first conductivity type, a second portion 105 of the first conductivity type, followed by the body region 220 and an insulating cover layer 253. The first portion 104 of the semiconductor substrate may have a concentration gradient of the dopants. The doping concentration of the first portion 104 is larger than a doping concentration of the second portion 105. The trench 112 extends to the first portion 104 of the semiconductor substrate.

Figure 2B:
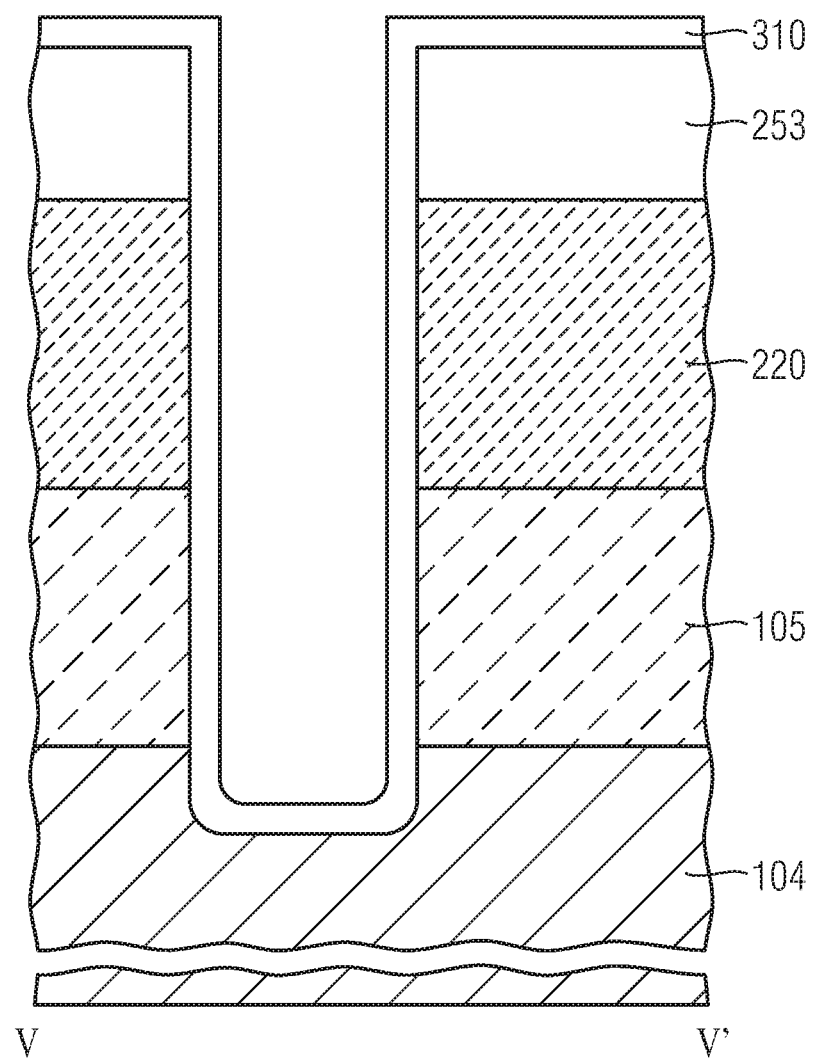

A diffusion material layer 310 of a material serving as a diffusion source is formed over the sidewalls and the bottom side of the source contact groove 112. Examples of the diffusion material layer 310 comprise doped glass layers, e.g. glass layers doped with dopants of the first conductivity type, e.g. BSG (borosilicate glass). For example, the diffusion material layer 310 may be formed by an LPCVD method ("low pressure chemical vapor deposition"). The diffusion material layer 310 may be formed as a conformal layer. The thickness of the layer may be in a range of 10-200 nm. FIG. 2B shows an example of a resulting structure.

Thereafter, a photoresist layer is formed to fill the source contact groove 112 and to cover the surface of the substrate. A photolithographic method is performed using a stripe mask so as to expose and develop portions of the resist material 320. The resist material 320 may be removed from trench portions to uncover a first portion 114a of the sidewall 114 of the source contact groove 112 to a defined depth while leaving a second portion 114b of the sidewall covered. In particular, an upper surface of the remaining resist material 320 may be disposed adjacent to the body region 220. Thereafter, according to an embodiment, an angled ion implantation step may be performed. The angle of the ion implantation is selected so that dop ants may be introduced through the first portion 114a of the sidewall 114 of the trench 112 into the substrate material 100. The ion implantation step may be performed with dopants of the second conductivity type, e.g. n-type dopants.

Figure 2C:
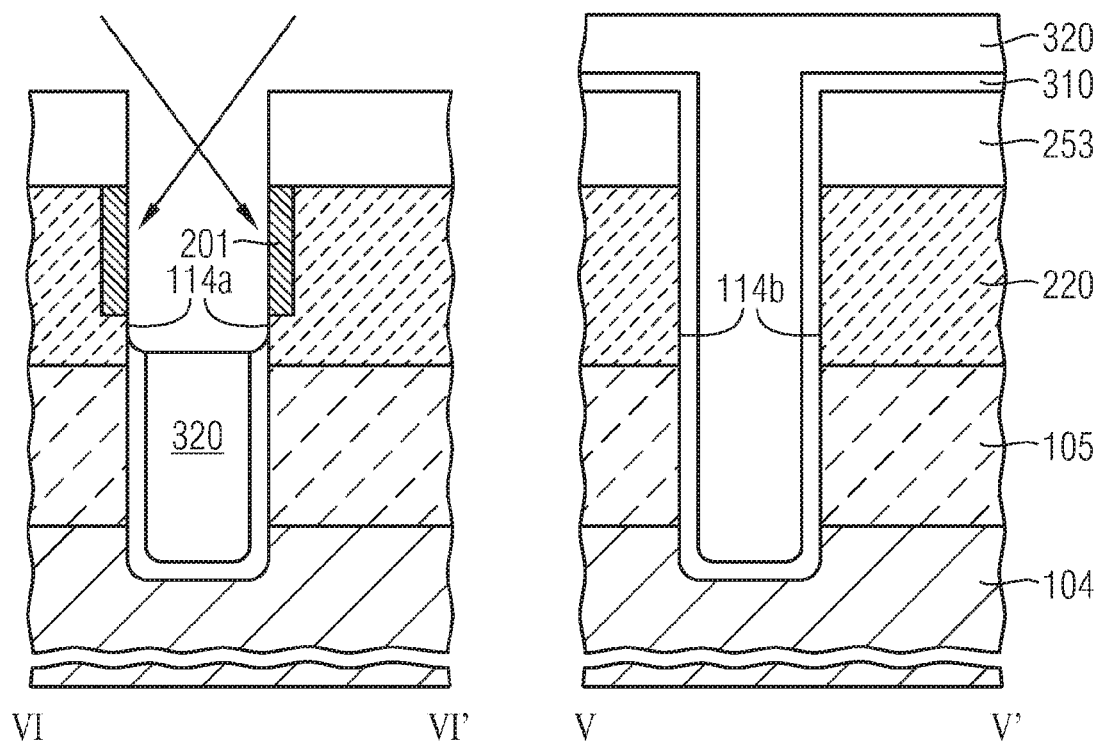

The right-hand portion of FIG. 2C shows an example of a resulting substrate at a portion in which the photoresist layer 320 has not been removed, i.e. a portion in which a source region 201 is not to be formed. This cross-sectional view is taken between V and V', as is also shown in FIG. 1C. The left-hand portion of FIG. 2C shows a cross-sectional view of a portion in which the photoresist layer 320 has been removed and in which the source region 201 is to be formed. The cross-sectional view is taken between VI and VI', as is also shown in FIG. 1C. The left-hand portion of FIG. 2C shows a cross-sectional view at the first portion 114a of the sidewall 114 of the source contact groove 112, whereas the right-hand portion of FIG. 2C shows a cross-sectional view at the second portion 114b of the sidewall 114 of the source contact groove 112. The diffusion material layer 310 is removed from the uncovered portions. This may be accomplished before or after performing the angled source implantation process.

Thereafter, a heat treatment is performed so as to cause diffusion of dopants from the diffusion material 310 through the sidewalls of the source contact groove 112 into the adjacent semiconductor material. As a result, a doped layer 315 is formed at portions of the sidewall 114 and the bottom side of the source contact groove 112. Optionally, the diffusion material layer 310 may be covered by a silicon oxide layer (e.g. formed by a PECVD method using TEOS as a precursor material) to prevent the dop ants from diffusion into the atmosphere and from entering the source regions 201 via the atmosphere.

Figure 2D:
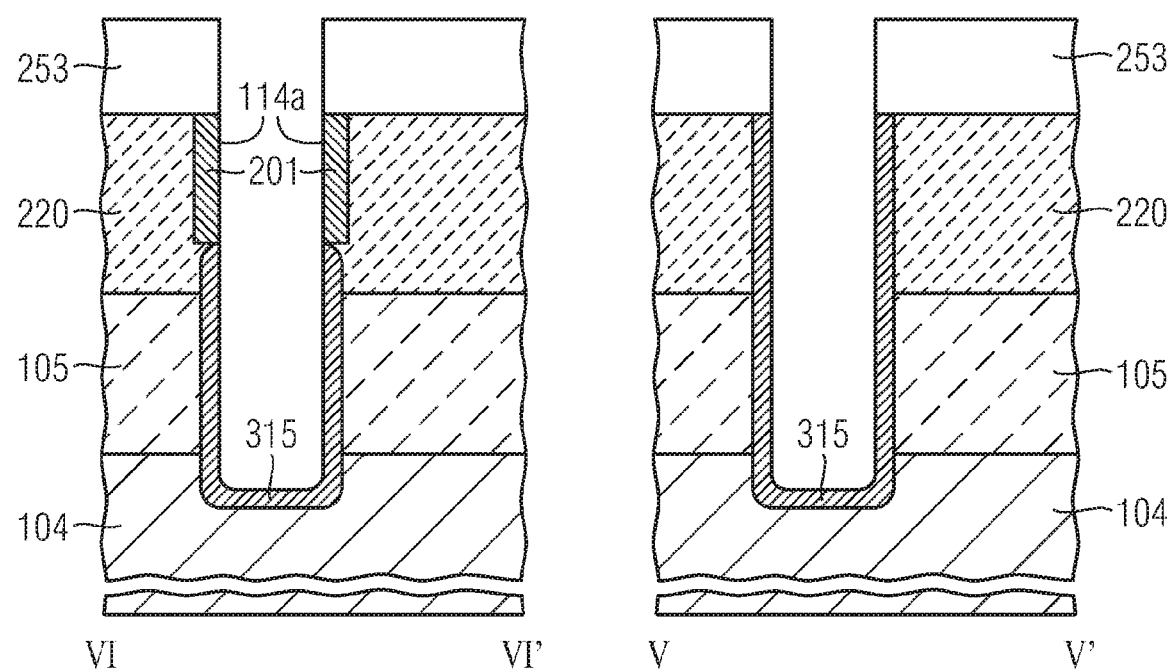

Thereafter, the diffusion material layer 310 and, optionally, the silicon oxide layer are removed from the sidewalls and the bottom side of the source contact groove 112. FIG. 2D shows cross-sectional views of an example of a resulting structure. As is shown in the left-hand portion of FIG. 2D, the source region 201 of the second conductivity type is formed at the first portion 114a of the sidewall of the source contact groove 112. The semiconductor material adjacent to a lower portion of the source contact groove 112 is doped with dopants of the first conductivity type. As is shown in the right-hand portion of FIG. 2D, the doped portion 315 of the first conductivity type extends along the whole depth of the source contact groove 112. Further, the bottom portion 315 of the source contact groove 112 is doped with dopants of the first conductivity type.

Figure 2E:
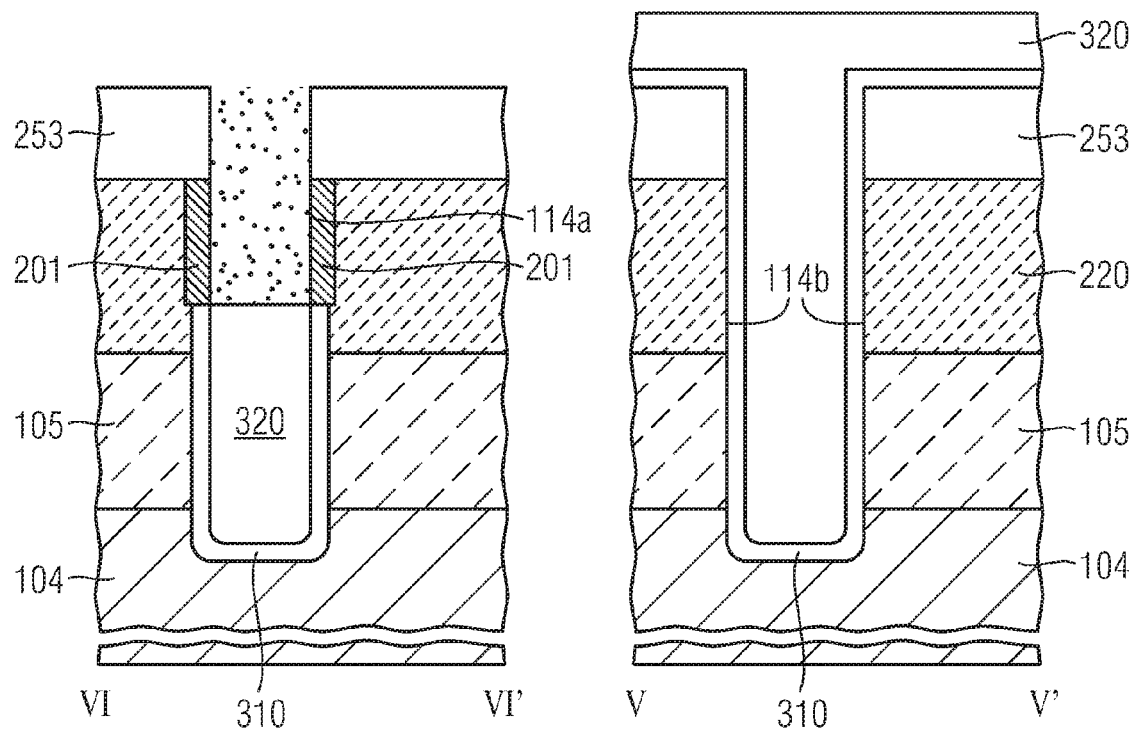

FIG. 2E shows a modification of the process according to which, starting from the structure shown in FIG. 2B, dopants of the second conductivity type are introduced by doping from the gas phase (GPD) or by plasma doping (PLAD, plasma assisted doping). According to a further modification (not illustrated), a further diffusion material layer comprising dop ants of the second conductivity type (e.g. ASG, "arsenic silicate glass") may be selectively formed at the sidewall 114 of the source contact groove 112. For example, starting from the structure shown in FIG. 2B forming a further diffusion material layer may comprise forming a thin silicon nitride layer over the diffusion material layer (e.g. the BSG layer) 310, followed by forming a resist material 320. The resist material as patterned using a stripe mask so as to uncover portions of nitride layer over the diffusion material layer 310. The thin silicon nitride layer and the diffusion material layer 310 are removed from the uncovered portions. Thereafter, the further diffusion material layer is formed so as to be in contact with the uncovered portions of the sidewall 114 of the source contact groove 112. Then, a heat treatment may be performed so as to simultaneously dope the first portions 114a of the sidewall 114 with dopants of the second conductivity type and to dope the second portions 114b of the sidewall with dopants of the first conductivity type.

The modification illustrated with reference to FIG. 2E may be useful in cases in which the source contact groove 112 has a high aspect ratio.

Figure 2F:
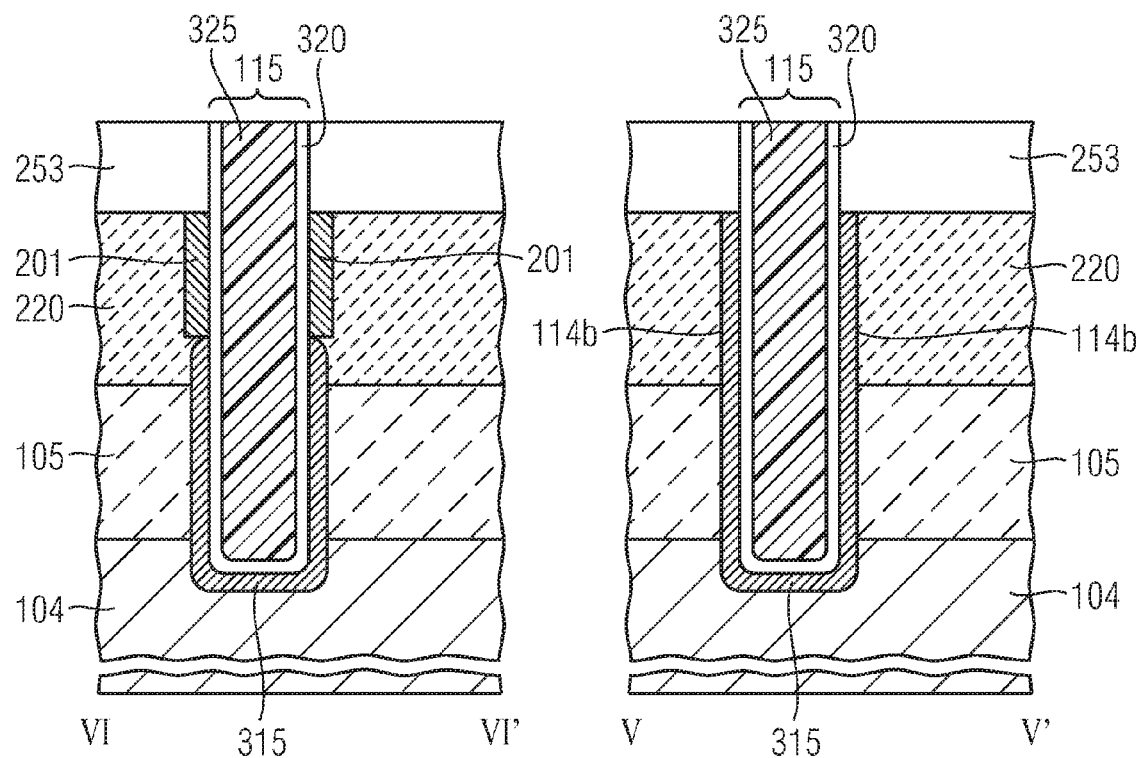

Thereafter, a conductive material 115 is filled in the source contact groove. For example, the conductive material 115 may comprise a Ti/TiN liner 320 which covers the sidewalls and the bottom side of the source contact groove 112. Thereafter, the liner 320 may be annealed. Thereafter, a fill material 325 such as tungsten may be deposited to fill the remaining portion of the source contact groove 112. Thereafter, a CMP ("chemical mechanical polishing") step is performed so as to remove the fill material from the surface of the semiconductor substrate 100. FIG. 2F shows an example of a resulting structure.

Figure 3A:
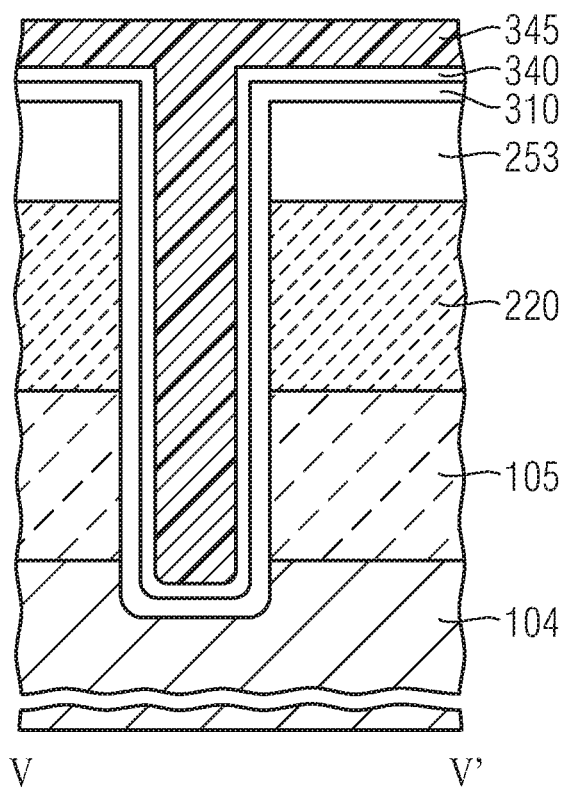
FIGS. 3A to 3F show cross-sectional views of the semiconductor substrate when performing a modification of the method.

FIGS. 3A to 3F illustrate a further method for forming a source contact groove having differently doped sidewall portions. A diffusion material layer 310 serving as a diffusion source such as a BSG layer is formed as a liner layer on the sidewalls and the bottom side of the source contact groove 112. Thereafter, a silicon nitride liner 340 is formed over the diffusion material layer 310. Then, a polysilicon layer 345 is filled and deposited on the surface of the workpiece. FIG. 3A shows an example of a resulting structure.

Thereafter, a lithographic process is performed using a mask having a stripe pattern. As a result, a photoresist pattern is formed over the polysilicon layer 345. An etching step for etching polysilicon is performed. For example, this process may comprise a dry etching process which anisotropically etches polysilicon. As a result, the polysilicon material 345 is recessed from the uncovered portions. A portion of the polysilicon layer 345 remains in the lower part of the source contact groove 112. Then, an isotropic etching step of etching silicon nitride is performed. A position of the surface of the polysilicon layer 345 in the source contact groove 112 approximately is disposed at a height of a boundary between the body region and the underlying substrate portion 105.

Figure 3B:
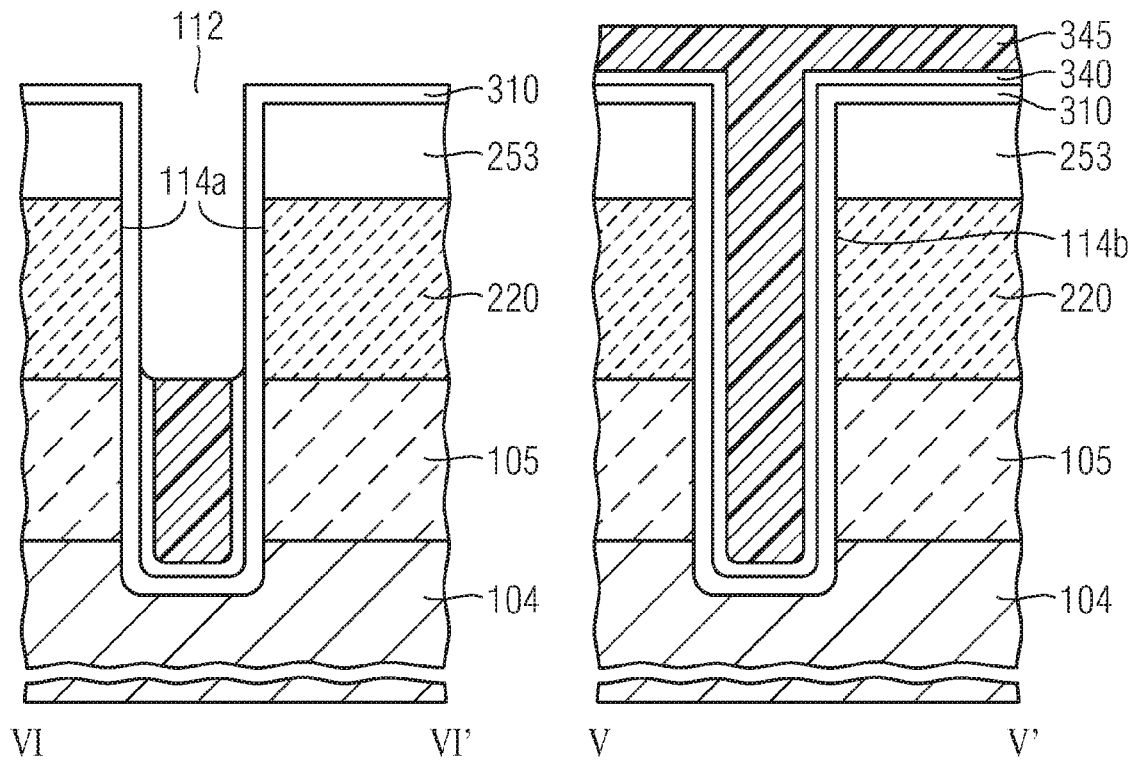
Figure 3C:
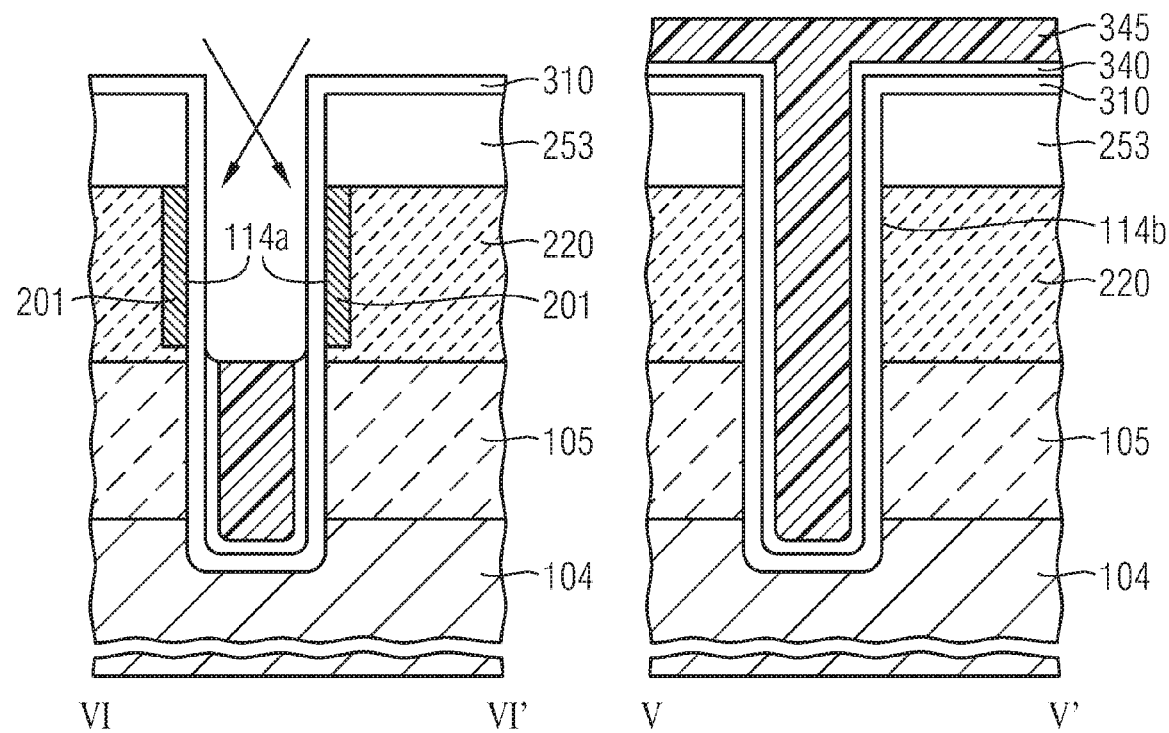
Figure 3D:
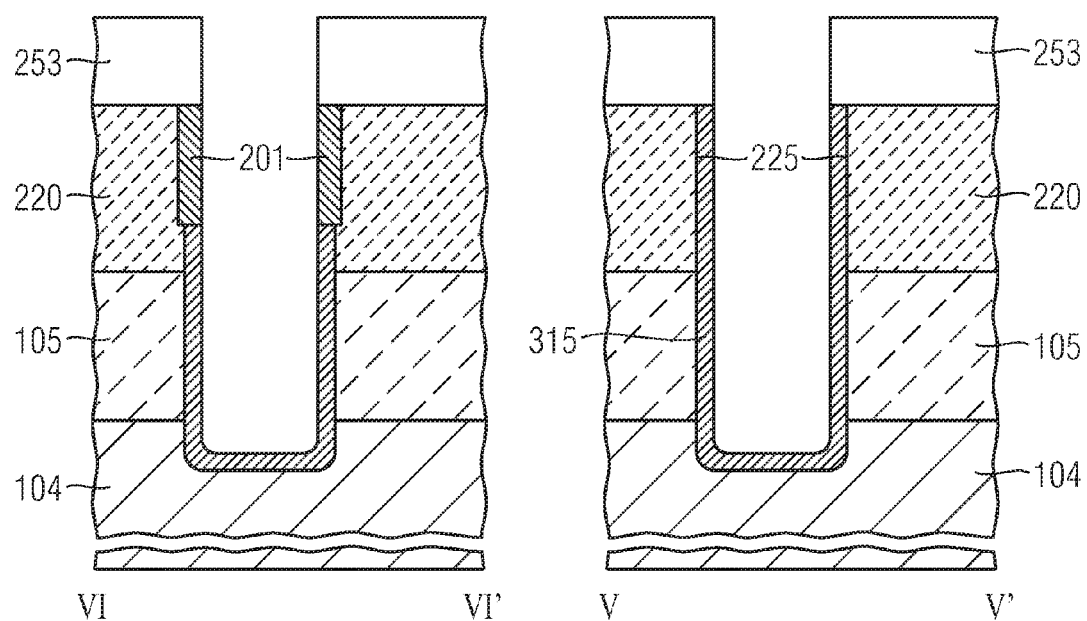

For example, etching may be performed in hot phosphoric acid. FIG. 3B shows example of a resulting structure. The left-hand portion of FIG. 3B shows a portion of the source contact groove 112 having a first sidewall portion 114a in which the source region 201 is to be formed. The polysilicon filling 345 is removed from a groove portion having the first sidewall portion 114a and the diffusion material layer 310 is uncovered. The right-hand portion of FIG. 3B shows the second sidewall portion 114b of the source contact groove 112.

Thereafter, an angled source implantation step is performed using dopants of the second conductivity type. As a result, as is shown in the cross-sectional view between VI and VI' in the left-hand portion of FIG. 3C, the source region 201 is formed at the first sidewall portion 114 of the source contact groove 112. Further, the second sidewall portion 114b of the source contact groove remains unaffected. The diffusion material layer 310 is removed from the uncovered portions. This may be accomplished before or after performing the angled source implantation process.

Thereafter, similar steps as have been described above with reference to FIGS. 2D and 2F may be performed. After removing the remaining polysilicon material 345, an annealing step is performed so as to diffuse the dopants from the diffusion material layer 310 into the semiconductor substrate 100. Thereafter, the silicon nitride layer 340 and the diffusion material layer 310 are removed from the semiconductor substrate. During the annealing step, the silicon nitride liner may act as a diffusion barrier which prevents dopants from out diffusing from the diffusion material layer 310.

Figure 3E:
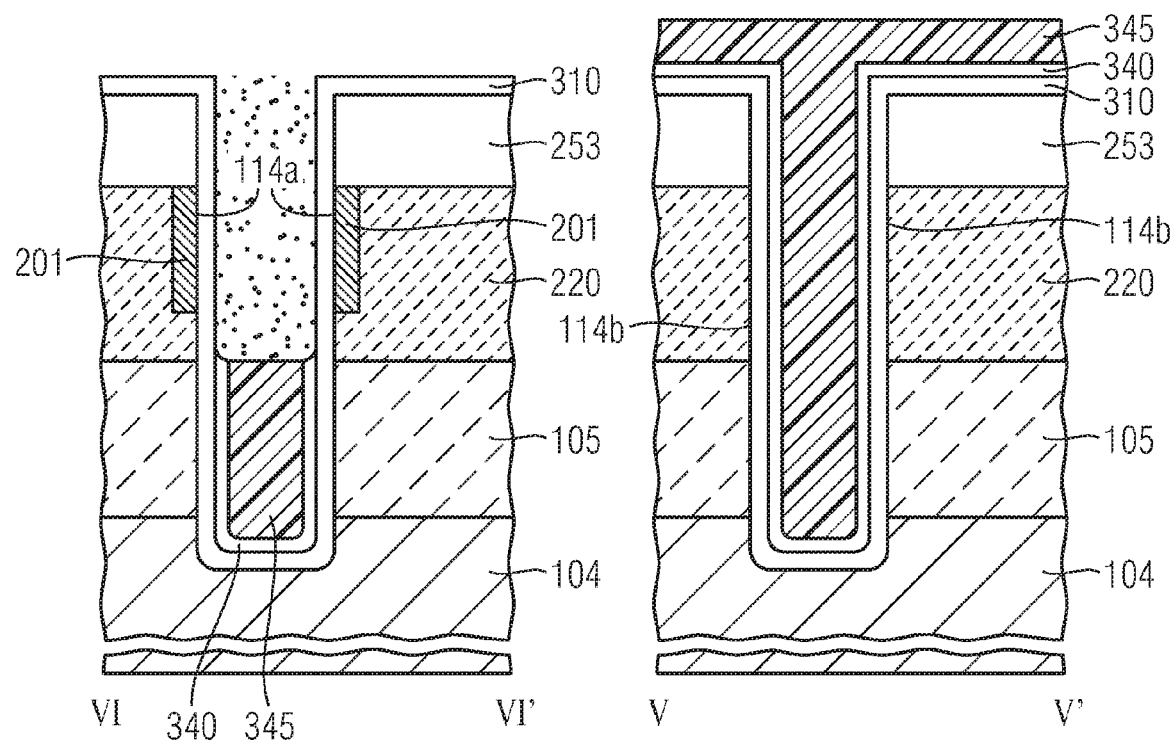

In a similar manner as has been explained above with reference to FIG. 2E, instead of the angled ion implantation step, a plasma assisted dopant process, a doping from the gas phase or a diffusion process from a further diffusion material layer for providing dopants of the second conductivity type may be performed so as to define the source regions 201. The left-hand portion of FIG. 3E illustrates the source contact groove 112 when performing a plasma doping or a gas phase doping process.

Figure 3F:
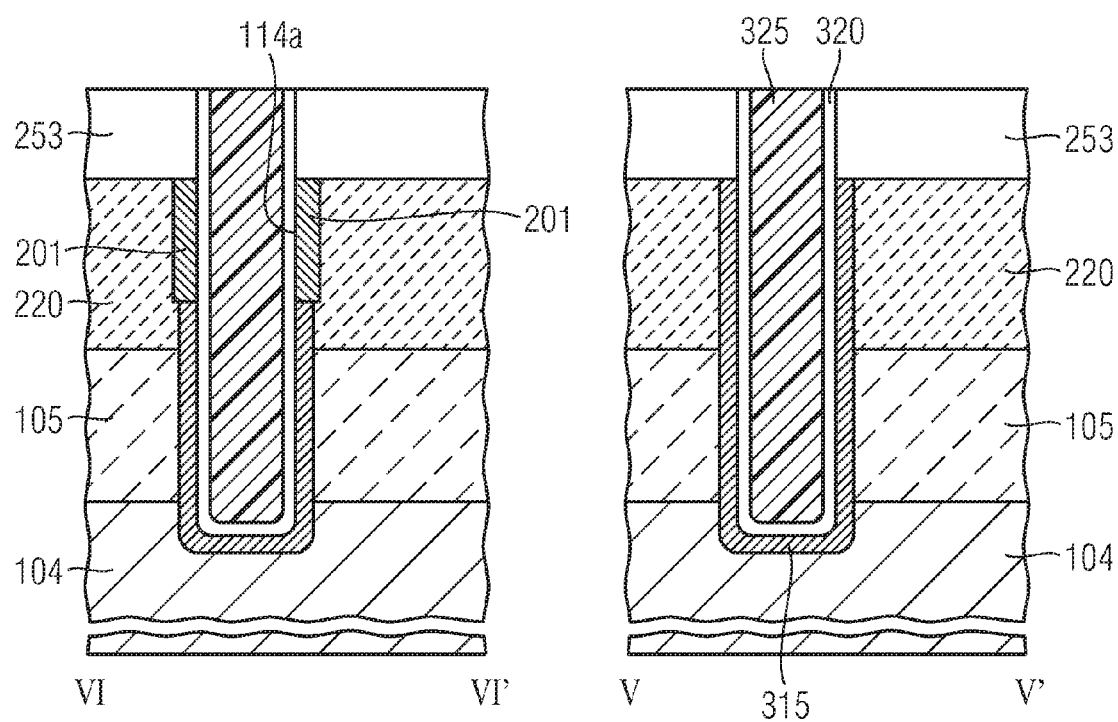

Thereafter, a source conductive material 115 is formed in the source contact groove 112 for forming the source contact. First, a Ti/TiN liner 320 may be formed on the sidewalls and the bottom side of the source contact groove. An annealing step of annealing the liner may be performed. Thereafter, a conductive filling 325 which may, e.g. comprise tungsten, may be formed in the source contact groove 112. A CMP ("chemical mechanical polishing") step is performed so as to remove portions on the main surface of the workpiece. FIG. 3F shows an example of the resulting substrate portion. In the left-hand portion of FIG. 3F, the source region 201 is formed adjacent to a first portion 114a of the sidewall of the source contact groove. As is shown in the right-hand portion of FIG. 3F, doped layer of the first conductivity type is formed adjacent to a second portion 114b of the sidewall and the bottom side of the source contact groove.

FIGS. 4A to 4D illustrates steps when forming the source contact groove 112 and the drain contact groove 430. As is, e.g. illustrated in FIG. 1A, the source contact groove 112 extends to a deeper depth than the drain contact groove 430. The following Figures show an example according to which these grooves may be formed by simultaneous processing steps.

A hard mask layer 405 is formed over the semiconductor substrate 100. For example, the hard mask layer 405 may comprise silicon oxide. An opening for defining the source contact groove is formed in the hard mask layer 405, e.g. by photolithographic method. Thereafter, the photoresist layer is removed from the surface of the workpiece.

Figure 4B:
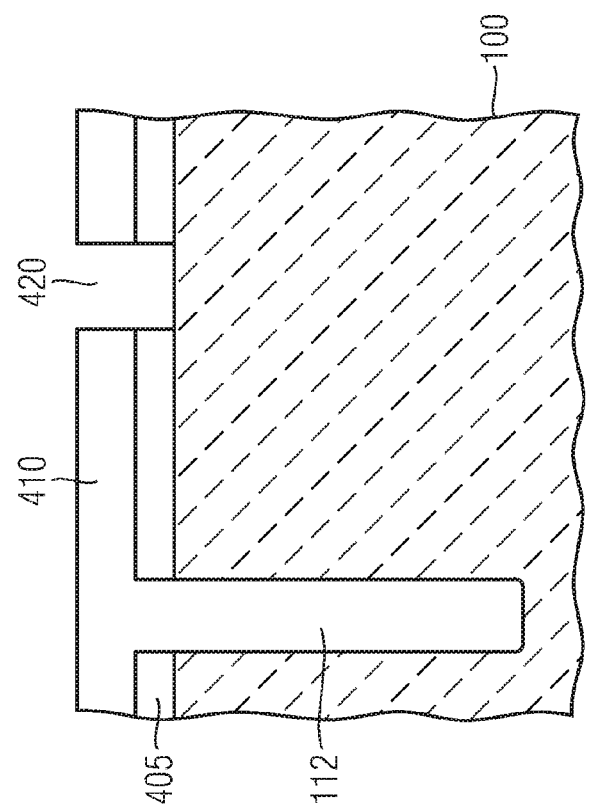
FIGS. 4A to 4D show cross-sectional views of the semiconductor device when forming further components of the semiconductor device.
Figure 4A:
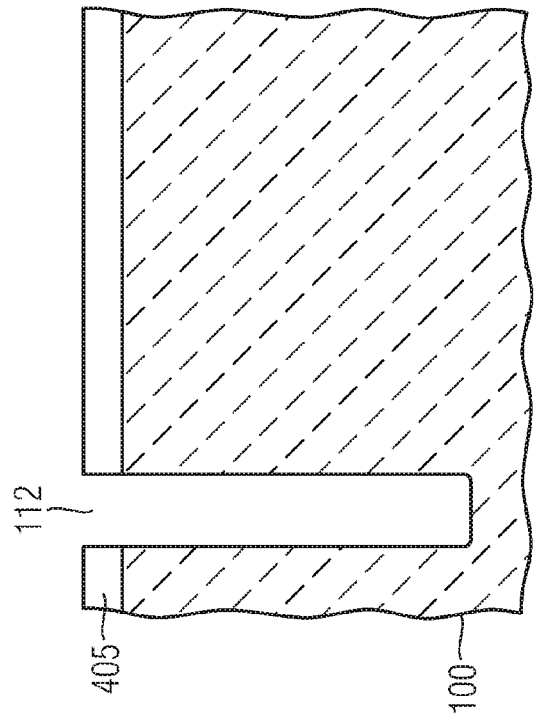

The semiconductor substrate is etched using the patterned hard mask layer 405 as an etching mask. FIG. 4A shows an example of a resulting structure.

After etching the source contact groove 112, optionally the doping processes that have been described with reference to FIGS. 3 and 4 may be performed. A photoresist layer 410 is formed over the workpiece. The photoresist layer 410 may fill the source contact groove 112. A photolithographic process is performed so as to define the drain contact groove. First, an opening 420 is formed in the photoresist layer and the hard mask layer 405. FIG. 4B shows an example of a resulting structure.

Figure 4C:
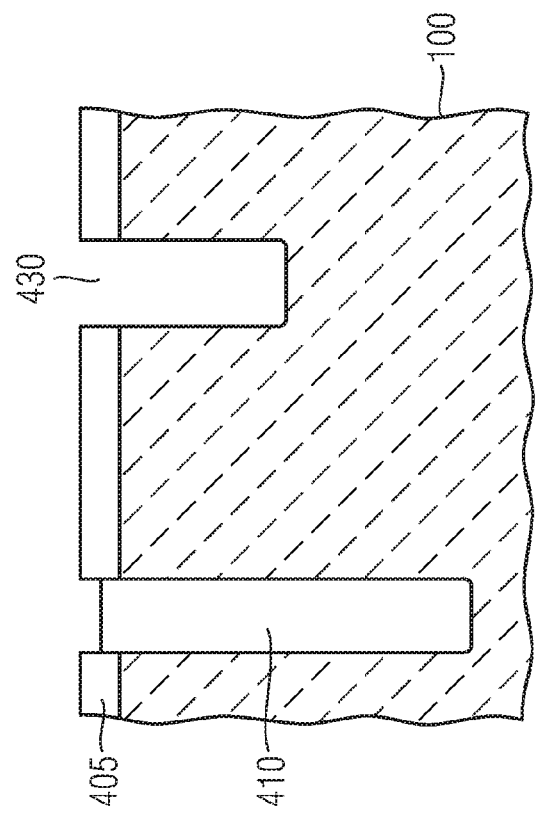

Thereafter, the photoresist material is recessed. For example, this may be accomplished by a dry etching process or ashing process. The process is performed so that the photoresist material remains in the source contact groove 112. The recessing step may be controlled so that the photoresist material is completely removed from the surface of the hard mask layer 405. For example, this may be accomplished by performing a spectroscopic method that analyzes the residual gases that may indicate that the photoresist has been removed from the surface. FIG. 4C shows an example of a resulting structure.

Figure 4D:
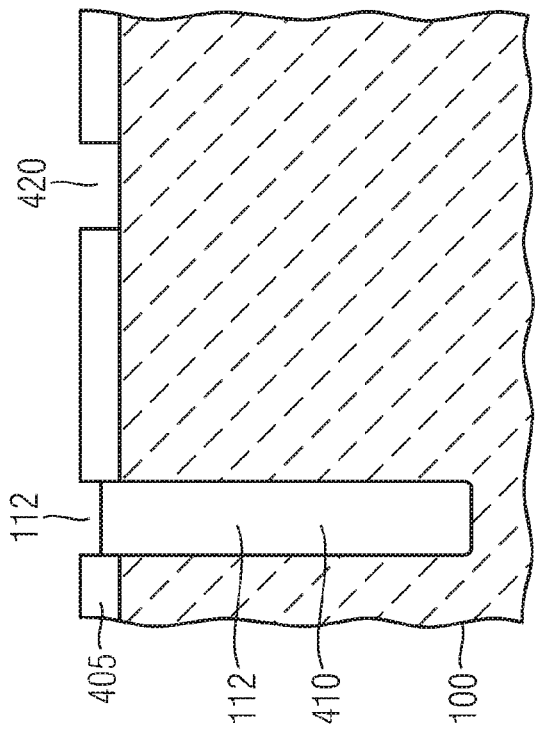

Thereafter, an etching process is performed so as to define the drain contact groove 430. FIG. 4D shows an example of a resulting structure. For example, thereafter, doping processes for doping the drain regions may be performed. Thereafter, the remaining portion of the photoresist material 410 is removed from the workpiece. Optionally, thereafter, doping processes may be performed in case the source regions and the drain regions are to be formed by simultaneous doping processes.

FIG. 5 summarizes a method according to an embodiment. A method of manufacturing a semiconductor device comprising a transistor cell in a semiconductor substrate having a first main surface comprises forming (S100) a source region, forming (S110) a source contact electrically connected to the source region, forming (S120) a drain region, forming (S130) a body region, forming (S140) a drift zone, and forming (S150) a gate electrode in a gate trench. The gate electrode is configured to control a conductivity of a channel formed in the body region. The body region and the drift zone are disposed along a first direction between the source region and the drain region, the first direction being parallel to the first main surface. Forming the source contact (S110) comprises forming a source contact groove (S160) in the first main surface of the semiconductor substrate to a depth larger than a depth of the gate trench and performing a doping process (S170) to introduce dopants of a second conductivity type through a first portion of a sidewall of the source contact groove and to introduce dopants of a first conductivity type through a second portion of the sidewall of the source contact groove. As is clearly to be understood, the single processes may be performed in an arbitrary order, depending on the process flow for manufacturing the respective components. Further, single processes may be performed by joint or common processing methods according to which plural components are produced by one process.

Figure 6:
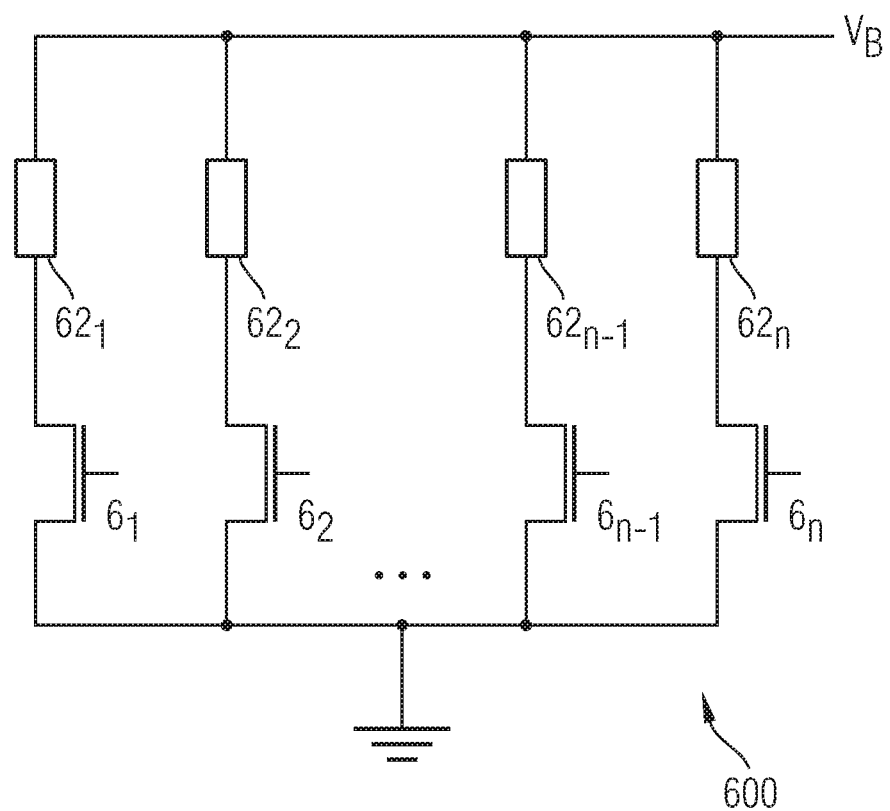
FIG. 6 shows an equivalent circuit diagram of an example of an electric device according to an embodiment.

FIG. 6 illustrates an embodiment of an integrated circuit. The integrated circuit 600 comprises a plurality of transistors $6_1$, $6_2$ to $6_n$ each comprising the semiconductor device 1 which has been described above with reference to FIGS. 1A to 1E. For example, each of the transistors $6_1$, $6_2$ to $6_n$ may comprise a plurality of transistor cells 10 that have been explained above. The source regions of the respective transistors may be connected with a common terminal, e.g. the ground terminal. The drain regions of the respective transistors may be connected to respective loads $62_1$, $62_2$, . . . $62_n$. The loads may further be connected to a common supply voltage terminal $V_B$, e.g. a battery. The integrated circuit shown in FIG. 6 comprising the semiconductor device as has been described above may implement a multi-low-side circuit. Due to the feature that the source region is electrically connected to the source metallization layer on the back side of the semiconductor device, and the drain region is electrically connected to the drain metallization layer on the top side of the semiconductor device, the semiconductor device implementing a lateral FinFET may be integrated in a smart manner to form the multi-low-side circuit.

Further embodiments of the integrated circuit relate to combinations of the semiconductor device as described herein with various loads such as a motor. For example, any of these integrated circuits may implement a low-side circuit in which the source terminal corresponds to the ground terminal.

FIG. 7A shows an example of an arrangement of transistor cells $73_1$, $73_2$, $73_3$, and $73_4$. For example, FIG. 7A shows a cross-sectional view of a portion of an integrated circuit 700 that may implement a component of an electric device such as a bridge circuit. FIG. 7A shows 4 transistor cells $73_1$, $73_2$, $73_3$, and $73_4$, wherein two adjacent transistor cells $73_1$, $73_2$ and $73_3$, $73_4$, are combined to pairs and form components of two different transistors $71_1$, $71_2$. The two adjacent transistor cells $73_1$, $73_2$ and $73_2$, $73_4$ share a common drain contact 706, respectively. The drain region of transistor $71_1$ is electrically connected to a first drain terminal 701 via a portion of the drain contact layer 140. Further, the drain region of transistor $71_2$ is electrically connected to a second drain terminal 702 via another portion of the drain contact layer 140. The source regions of the transistors $71_1$, $71_2$ are electrically connected to a common source terminal.

The integrated circuit 700 may comprise a plurality of semiconductor devices $71_1$, $71_2$, . . . $71_n$ according to an embodiment. Each of the semiconductor devices $71_1$, $71_2$, . . . $71_n$ may comprise a plurality of single transistor cells that are connected in parallel. As is illustrated in FIG. 7A, the semiconductor devices $71_1$, $71_2$, . . . $71_n$ may be disposed in a single substrate. Each of the semiconductor devices $71_1$, $71_2$, . . . $71_n$ may comprise the components that have been explained above with reference to the previous figures. For example, the components of the single transistors of the pair of adjacent transistor cells $73_1$, $73_2$, $73_3$, $73_4$ may be arranged in a mirror-like fashion, so that the source contacts 202 of the two adjacent ones of the transistor cells $73_1$, $73_2$, $73_3$, $73_4$ are disposed at opposing sides of the pair of the adjacent ones of the transistors.

According to the embodiment shown in FIG. 7A, the source regions of the transistors $71_1$, $71_2$, . . . $71_n$ are electrically connected to a ground terminal. Due to the feature that the first source contact portion comprises a source conductive material 115 that extends in the second portion 105 of the semiconductor substrate and due to the special mirror-like arrangement of adjacent transistor cells, pairs of transistor cells may be insulated from adjacent pairs of transistor cells.

Figure 7B:
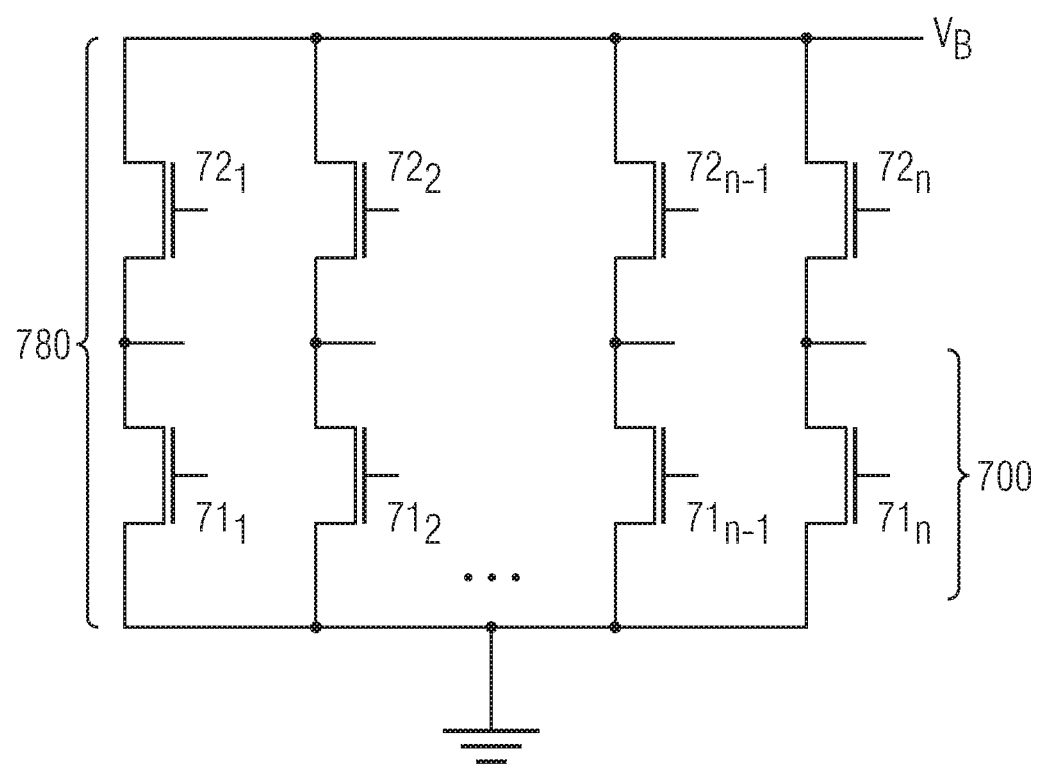
FIG. 7B shows an equivalent circuit diagram of an example of an electric device according to an embodiment.

The integrated circuit 700 may be combined with a circuit comprising a plurality of further transistors to form a bridge circuit 780 that is shown in FIG. 7B. For example, the further transistors $72_1$, $72_2$, . . . $72_n$ may be formed by an arbitrary technology and may be disposed on a different semiconductor chip. According to an embodiment, the further transistors may be packaged and may be electrically connected with terminals of the integrated circuit 700 to form a bridge circuit 780. The bridge circuit may, for example, implement a three phase BLDC ("brushless direct current") motor drive. Further examples of the bridge circuit comprise a rectifier or DCDC converters, e.g. such as Buck- and Boost converters.

Figure 8A:
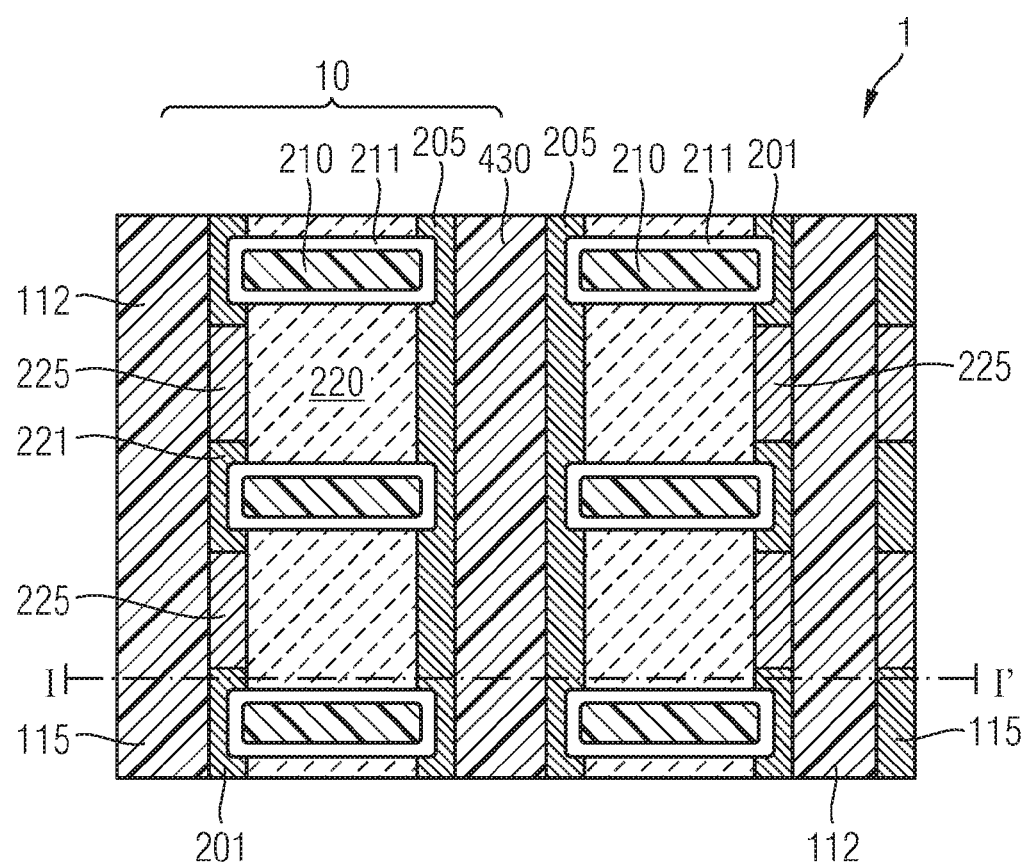
FIG. 8A shows a horizontal cross-sectional view of a portion of a semiconductor device according to an embodiment.

FIG. 8A shows a horizontal cross-sectional view of a semiconductor device according to a further embodiment. The embodiment shown in FIG. 8A is similar to the embodiment shown in any of FIGS. 1A to 1F. Differing from these embodiments, a drift zone is absent from the semiconductor device. Further, field plates are absent from the semiconductor device. Accordingly, the drain region 205 is directly adjacent to the body region 220. In the arrangement shown in FIG. 8A, the transistor cells 10 are disposed on opposite sides of a drain contact groove 430. The semiconductor device 1 shown in FIG. 8A implements a so-called low voltage MOSFET which may be operated at lower voltages than usual power transistors. For example, the semiconductor device illustrated in FIGS. 8A and 8B may be operated at voltages lower than 40 V. In the embodiment shown in FIG. 8A, the drain region 205 is disposed directly adjacent to the gate dielectric 211 which is disposed adjacent to the gate electrode 210.

Figure 8B:
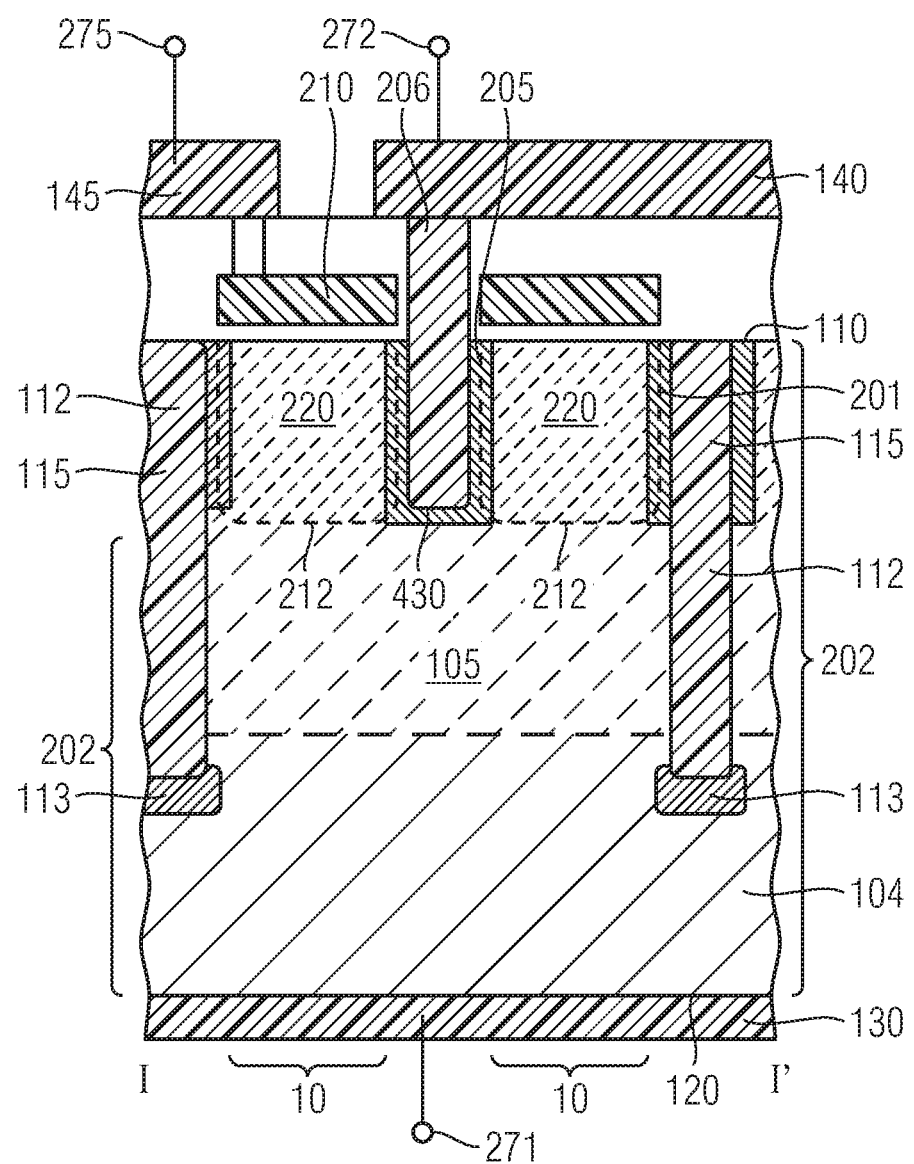
FIG. 8B shows a vertical cross-sectional view of the semiconductor device shown in FIG. 8A.

FIG. 8B shows a vertical cross-sectional view of the semiconductor device shown in FIG. 8A. For example, the cross-sectional view of FIG. 8B may be taken between I and I' as is also indicated in FIG. 8A. As is shown, the source contact groove 112 and the drain contact groove 430 may be arranged in the layer 105 of the first conductivity type. As a consequence, the drain region 205 is directly adjacent to the body region 220, the drain contact 206 being directly adjacent to the drain region 205. The further components of the semiconductor device are similar to those illustrated with reference to FIGS. 1A to 1E. A gate metallization layer 145 is disposed on a side of the first main surface 110 of the semiconductor substrate. The gate metallization layer 145 electrically connects the gate electrode 210 to a gate terminal 275. The drain contact 206 is electrically connected via a drain metallization layer 140 to a drain terminal 272. The further components of the semiconductor device have been illustrated with reference to the Figures above. For example, the semiconductor device shown in FIGS. 8A and 8B may be formed using the method which has been illustrated with reference to FIGS. 2A to 5. For example, a semiconductor substrate which may be of the first conductivity type, e.g. p-type, may be used as a starting material. The semiconductor substrate may be doped at a portion adjacent to the second main surface 120 thereof to form a heavily doped portion of the first conductivity type to form the first portion 104.

The semiconductor device shown in FIGS. 8A and 8B may e.g. be used as a part of a battery. For example, in a Li-ion battery, single cells of the battery should be switched separately from each other by means of a low-resistance low-voltage switch which may be operated at voltages of 5-10 V. These low-resistance switches carry the entire battery current, which may be 100-500 A. Due to the special construction of the switch, power losses may be less than 5 W.

Figure 8C:
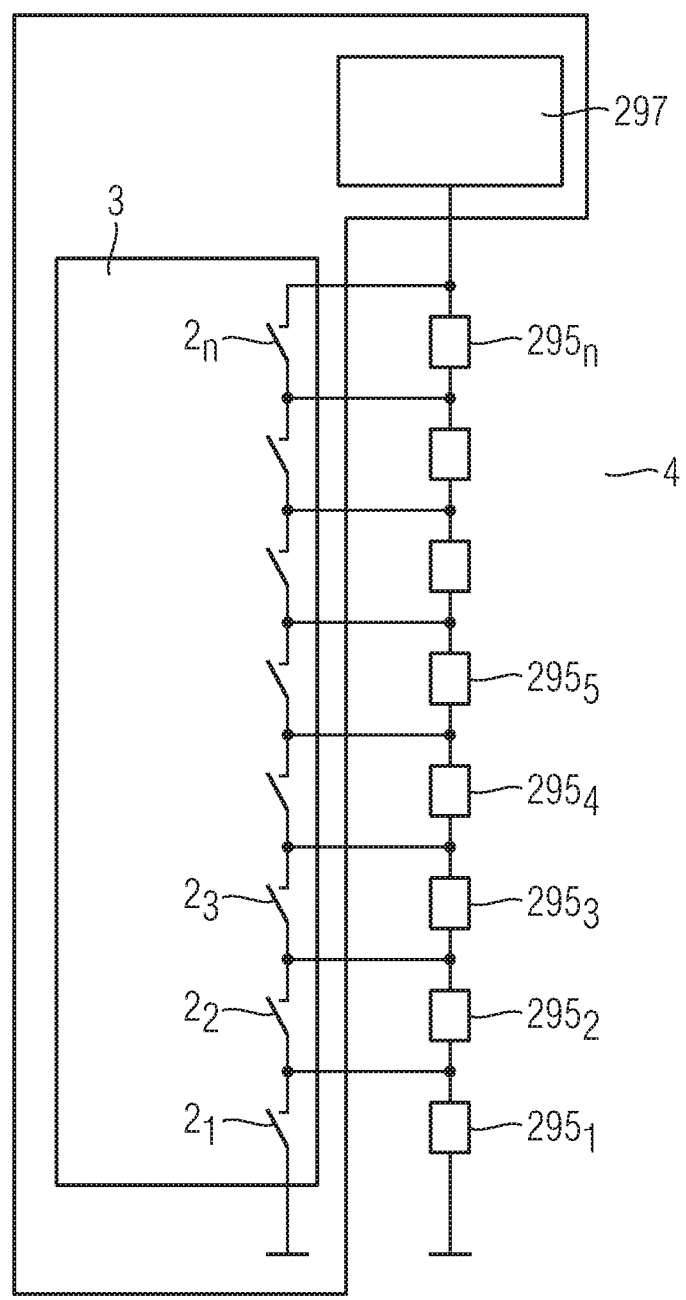
FIG. 8C shows an equivalent circuit diagram of a system according to an embodiment.

FIG. 8C shows an equivalent circuit diagram of a system 4 according to an embodiment. The system comprises an integrated circuit 3 including a plurality of switches $2_1, \ldots 2_n$ that are connected in series. Any of the switches $2_1, 2_2, \ldots 2_n$ may be implemented by the semiconductor device 1 which has been explained with reference to FIGS. 8A and 8B. The system 4 comprises a plurality of loads $295_1, \ldots 295_n$. For example, the loads may be implemented by cells of a lithium ion battery or by LEDs. For example, each of the LEDs may have a forward voltage of 3-4 V. Each of the loads is connected parallel to a corresponding one of the switches $2_1, \ldots 2_n$. This circuit may be connected to a suitable DC/DC converter 297, e.g. a Buck-Boost converter. By activating corresponding ones of the switches $2_1, \ldots 2_n$, selected ones of the loads $295_1, \ldots 295_n$ may be switched off. The switches $2_1, \ldots 2_n$ may carry the entire current and may have a low resistance, thereby enabling low power losses.

The above embodiments serve merely as examples, and are not to be construed as limiting. Additional exemplary embodiments are provided below.

Embodiments:

1. A semiconductor device (1) comprising a transistor cell (10, 731, 732, 733, 734) in a semiconductor substrate (100) having a first main surface (110), the transistor cell (10) comprising: a source region (201); a source contact electrically connected to the source region (201), the source contact comprising a first source contact portion (202) and a second source contact portion (130); a drain region (205); a body region (220); and a gate electrode (210) in a gate trench (212) in the first main surface adjacent to the body region (220), the gate electrode (210) being configured to control a conductivity of a channel in the body region (220), a longitudinal axis of the gate trench (212) extending in a first direction parallel to the first main surface, the source region (201), the body region (220) and the drift zone drain region (205) being disposed along the first direction, the second source contact portion (130) being disposed at a second main surface (120) of the semiconductor substrate (100), the first source contact portion (202) comprising a source conductive material (115) in direct contact with the source region (201) and a portion of the semiconductor substrate (100) arranged between the source conductive material (115) and the second source contact portion (130).

2. The semiconductor device according to embodiment 1, wherein the source conductive material (115) extends in the semiconductor substrate to a depth larger than a depth of the gate trench (212).

3. The semiconductor device according to embodiment 1 or 2, wherein the source conductive material (115) is disposed in a source contact groove (112) formed in the first main surface (110).

4. The semiconductor device according to embodiment 3, wherein the source region (201) is formed at a sidewall (114) of the source contact groove (112).

5. The semiconductor device according to embodiment 3 or 4, further comprising a body contact portion (225) at a sidewall of the source contact groove (112), adjacent to the source region (201).

6. The semiconductor device according to any of the preceding embodiments 1, further comprising a field plate (250) in a field plate trench (252) in the first main surface and a drain contact electrically connected to the drain region (205), the drain contact being disposed in a drain contact groove (430), the drain contact groove (430) extending to a deeper depth than the field plate trench (252).

7. The semiconductor device according to any of embodiments 1 to 6, wherein the semiconductor substrate (100) comprises a first portion (104) and a second portion (105), the first portion (104) having a larger distance to the first main surface (110) than the second portion (105), the first portion (104) having a larger doping concentration than the second portion (105), the first portion (104) comprising a contact portion (113) having a higher doping concentration than a remaining part of the first portion(104), the contact portion (113) being in contact with the source conductive material (115).

8. The semiconductor device according to any of embodiments 1 to 6, wherein the semiconductor substrate (100) comprises a first portion (104) and a second portion (105), the first portion (104) having a larger distance to the first main surface (110) than the second portion (105), the first portion (104) having a larger doping concentration than the second portion (105), the first portion (104) being a component of the first source contact portion (202).

9. The semiconductor device according to embodiment 7 or 8, wherein the first and the second portion (104, 105) of the semiconductor substrate (100) are of first conductivity type, and the source and the drain region (201, 205) are of a second conductivity type.

10. The semiconductor device according to embodiment 9, wherein a pn junction is formed between the drain region (205) and the second portion (105) of the semiconductor substrate (100).

11. The semiconductor device according to embodiment 8, further comprising a drain contact electrically connected to the drain region (205), the drain contact being disposed in a drain contact groove (430), the drain contact groove (430) extending to the second portion (105) of the semiconductor substrate (100).

12. The semiconductor device according to any of the preceding embodiments 1, further comprising a drain contact layer (140) at the first main surface (110) of the semiconductor substrate (100).

13. The semiconductor device according to any of the preceding embodiments 1, further comprising a drift zone (260) disposed between the body region (220) and the drain region (205).

14. An integrated circuit (600, 700) comprising a plurality of semiconductor devices (1) according to any of embodiments 1 to 13, wherein the source regions of the semiconductor devices (1) are electrically connected with a common terminal.

15. The integrated circuit (600, 700) according to embodiment 14, wherein two adjacent ones of the transistor cells (731, 732; 733, 734) are arranged so as to share a common drain contact (706), wherein the source contacts (202) of the two adjacent ones of the transistor cells (731, 732; 733, 734) are disposed at opposing sides of the pair of the adjacent ones of the transistor cells.

16. An electric device comprising the integrated circuit (600, 700) according to embodiment 14 or 15, and a plurality of loads (621, 622, . . . 62n) electrically connected to the drain regions of the respective semiconductor devices (1).

17. An electric device comprising the integrated circuit (600, 700) according to embodiment 14 or 15, and a plurality of further transistors (721, 722, . . . 72n) electrically connected to the drain regions of the respective semiconductor devices.

18. An integrated circuit (3) comprising a plurality of semiconductors devices according to any of embodiments 1 to 13 connected in series.

19. A system (4) comprising the integrated circuit (3) according to embodiment 16 and a plurality of loads (2951, . . . 295n) connected parallel to corresponding ones of the semiconductor devices.

20. A method of manufacturing a semiconductor device (1) comprising a transistor cell (10, 731, 732, 733, 734) in a semiconductor substrate (100) having a first main surface (110), comprising: forming (S100) a source region (201); forming (S110) a source contact electrically connected to the source region (201); forming (S120) a drain region (205); forming (S130) a body region (220); and forming (S150) a gate electrode (210) in a gate trench (212), the gate electrode (210) being configured to control a conductivity of a channel formed in the body region (220), the source region (201), the body region (220) and the drain region (205) being disposed along a first direction, the first direction being parallel to the first main surface, forming the source contact (S110) comprising forming a source contact groove (S160) in the first main surface of the semiconductor substrate to a depth larger than a depth of the gate trench (212); and performing a doping process (S170) to introduce dopants of a second conductivity type through a first portion (114a) of a sidewall (114) of the source contact groove (112) and to introduce dopants of a first conductivity type through a second portion (114b) of the sidewall of the source contact groove (112).

21. The method according to embodiment 20, wherein performing the doping process comprises: forming a diffusion material layer (310) on a sidewall (114) and a bottom side of the source contact groove (112), patterning the diffusion material layer (310) to uncover portions of the sidewall (114), introducing dopants of the second conductivity type through the uncovered portions; and performing a heat treatment to introduce dopants of the first conductivity type through the covered portions.

22. The method according to embodiment 21, wherein patterning the diffusion material layer (310) is performed so as to uncover upper portions of the sidewall while leaving lower portions of the sidewall covered.

23. The method according to any of embodiments 20 to 22, further comprising forming a drain contact groove (430) to form a drain contact (206) electrically connected to the drain region (205).

24. The method according to embodiment 23, wherein forming the source contact groove (112) and forming the drain contact groove (430) comprises joint etching processes.

While embodiments have been described above, it is obvious that further embodiments may be implemented. For example, further embodiments may comprise any subcombination of features recited in the claims or any subcombination of elements described in the examples given above. Accordingly, this spirit and scope of the appended claims should not be limited to the description of the embodiments contained herein.

What is claimed is:

1. A method of manufacturing a semiconductor device comprising a transistor cell in a semiconductor substrate having a first main surface and a second main surface, the method comprising:
    forming a source region;
    forming a source contact electrically connected to the source region, the source contact comprising a first source contact portion and a second source contact portion, the second source contact portion being disposed at the second main surface;
    forming a drain region;
    forming a body region; and
    forming a gate electrode in a gate trench in the first main surface adjacent to the body region, the gate electrode being configured to control a conductivity of a channel formed in the body region, a longitudinal axis of the gate trench extending in a first direction parallel to the first main surface,
    the source region, the body region and the drain region being disposed along the first direction,
    forming the first source contact portion comprises forming a source contact groove in the first main surface of the semiconductor substrate to a depth larger than a depth of the gate trench, and filling the source contact groove with a source conductive material such that the source conductive material is in direct contact with the source region, wherein the source conductive material extends partially into a first doped portion of the semiconductor substrate, and wherein the first doped portion includes a region arranged between the source conductive material and the second source contact portion;
    forming the semiconductor substrate, wherein the semiconductor substrate comprises the first doped portion and a second doped portion having a same conductivity type, the first doped portion having a larger distance to the first main surface than the second doped portion, the first doped portion having a larger doping concentration than the second doped portion, the first doped portion being in direct contact with the first source contact portion; and
    forming a drain contact electrically connected to the drain region, the drain contact being disposed in a drain contact groove, and wherein the drain contact groove at least partially extends into the second doped portion of the semiconductor substrate.

2. The method according to claim 1, further comprising:
    forming the drain contact groove to form the drain contact electrically connected to the drain region.

3. The method according to claim 2, wherein forming the source contact groove and forming the drain contact groove comprises joint etching processes.

4. The method according to claim 1, wherein:
forming the first doped portion comprises forming a contact portion in the first doped portion, the contact portion having a higher doping concentration than a remaining part of the first doped portion, and the contact portion formed in contact with the source conductive material.

5. The method according to claim 1, wherein the first doped portion and the second doped portion of the semiconductor substrate are of a first conductivity type, and the source region and the drain region are of a second conductivity type.

6. The method according to claim 1, performing a doping process to introduce dopants of a second conductivity type through a first portion of a sidewall of the source contact groove and to introduce dopants of a first conductivity type through a second portion of the sidewall of the source contact groove.

7. The method according to claim 6, wherein performing the doping process comprises:
forming a diffusion material layer on a sidewall and a bottom side of the source contact groove;
patterning the diffusion material layer to uncover portions of the sidewall;
introducing dopants of the second conductivity type through the uncovered portions of the sidewall; and
performing a heat treatment to introduce dopants of the first conductivity type through covered portions of the sidewall.

8. The method according to claim 7, wherein patterning the diffusion material layer is performed so as to uncover upper portions of the sidewall while leaving lower portions of the sidewall covered.

9. The method according to claim 6, wherein the source region is formed at the first portion of the sidewall of the source contact groove by the doping process.

10. The method according to claim 6, wherein:
forming the source region includes the doping process to introduce the dopants of the second conductivity type through the first portion of the sidewall of the source contact groove such that the source region is formed at the first portion of the sidewall of the source contact groove.

11. The method according to claim 6, wherein a doped layer is formed at the second portion of the sidewall of the source contact groove by the doping process to introduce the dopants of the first conductivity type through the second portion of the sidewall of the source contact groove.

12. A semiconductor device comprising:
a semiconductor substrate having a first main surface; and
a transistor cell in the semiconductor substrate, the transistor cell comprising:
a source region;
a source contact electrically connected to the source region, the source contact comprising a first source contact portion and a second source contact portion;
a drain region;
a drain contact electrically connected to the drain region, the drain contact being disposed in a drain contact groove;
a body region; and
a gate electrode in a gate trench in the first main surface adjacent to the body region, the gate electrode being configured to control a conductivity of a channel in the body region, a longitudinal axis of the gate trench extending in a first direction parallel to the first main surface,
wherein the source region, the body region and the drain region being disposed along the first direction,
the second source contact portion being disposed at a second main surface of the semiconductor substrate, and
the first source contact portion comprising a source conductive material in direct contact with the source region and that extends partially into a first doped portion of the semiconductor substrate, wherein the first doped portion includes a region arranged between the source conductive material and the second source contact portion,
the semiconductor substrate comprises the first doped portion and a second doped portion having a same conductivity type, the first doped portion having a larger distance to the first main surface than the second doped portion, the first doped portion having a larger doping concentration than the second doped portion, the first doped portion being in direct contact with the first source contact portion, and
the drain contact groove at least partially extending into the second doped portion of the semiconductor substrate.

* * * * *